US012239002B2

(12) United States Patent
Xu et al.

(10) Patent No.: US 12,239,002 B2
(45) Date of Patent: Feb. 25, 2025

(54) DISPLAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Jingjing Xu, Beijing (CN); Xueguang Hao, Beijing (CN); Chunyan Li, Beijing (CN); Lang Liu, Beijing (CN); Jingquan Wang, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/263,634

(22) PCT Filed: Jul. 6, 2022

(86) PCT No.: PCT/CN2022/104153
§ 371 (c)(1),
(2) Date: Jul. 31, 2023

(87) PCT Pub. No.: WO2023/029742
PCT Pub. Date: Mar. 9, 2023

(65) Prior Publication Data
US 2024/0107850 A1    Mar. 28, 2024

(30) Foreign Application Priority Data
Aug. 30, 2021    (CN) .......................... 202111001585.5

(51) Int. Cl.
*G06F 3/044*    (2006.01)
*G06F 3/041*    (2006.01)
(Continued)

(52) U.S. Cl.
CPC ........... *H10K 59/40* (2023.02); *G06F 3/0412* (2013.01); *G06F 3/0418* (2013.01);
(Continued)

(58) Field of Classification Search
CPC .... H10K 59/40; H10K 59/126; H10K 59/131; H10K 59/873; H10K 59/12;
(Continued)

(56) References Cited

U.S. PATENT DOCUMENTS 10,490,620 B1\*  11/2019  Lai ....................... H10K 59/131
2016/0041663 A1\*  2/2016  Chen .................. G06V 40/1318
345/174

(Continued)

FOREIGN PATENT DOCUMENTS

CN    106775124 A    5/2017
CN    107634086 A    1/2018
(Continued)

OTHER PUBLICATIONS

The International Search Report mailed Sep. 16, 2022; PCT/CN2022/104153.
(Continued)

*Primary Examiner* — Jose R Soto Lopez

(57) ABSTRACT

A display substrate and a display device are provided. The display substrate includes a display region and an opening located in the display region, the opening penetrates through the display substrate, and the display substrate includes a base substrate, a driving circuit layer, a light-emitting component layer, an encapsulation layer, and a touch control layer. The driving circuit layer includes a first signal line at least partially surrounding the opening; the light-emitting component layer is provided on a side of the driving circuit layer away from the base substrate; the encapsulation layer is provided on a side of the light-emitting component layer
(Continued)

away from the base substrate; the touch control layer includes a touch control electrode and a touch control compensation electrode at least partially surrounding the opening; the first signal line at least partially overlaps with the touch control compensation electrode.

20 Claims, 17 Drawing Sheets

(51) Int. Cl.
*H10K 59/126* (2023.01)
*H10K 59/131* (2023.01)
*H10K 59/40* (2023.01)
*G09G 3/3225* (2016.01)

(52) U.S. Cl.
CPC .......... *G06F 3/0445* (2019.05); *G06F 3/0446* (2019.05); *H10K 59/126* (2023.02); *H10K 59/131* (2023.02); *G09G 3/3225* (2013.01); *G09G 2300/0819* (2013.01); *G09G 2300/0842* (2013.01); *G09G 2354/00* (2013.01)

(58) Field of Classification Search
CPC .... G06F 3/0412; G06F 3/0418; G06F 3/0445; G06F 3/0446; G06F 3/0448; G06F 3/0416; G06F 3/044; G09G 3/3225; G09G 2300/0819; G09G 2300/0842; G09G 2354/00
See application file for complete search history.

(56) References Cited

U.S. PATENT DOCUMENTS

| | | | | |
|---|---|---|---|---|
| 2019/0088685 | A1* | 3/2019 | Huang | H01L 27/1262 |
| 2019/0098748 | A1* | 3/2019 | Guo | G06F 1/1688 |
| 2020/0044006 | A1* | 2/2020 | Lee | H10K 50/841 |
| 2020/0110495 | A1 | 4/2020 | Han et al. | |
| 2020/0110525 | A1* | 4/2020 | Park | H10K 59/40 |
| 2020/0142525 | A1 | 5/2020 | Han et al. | |
| 2020/0168671 | A1* | 5/2020 | Jang | H10K 59/131 |
| 2020/0175918 | A1* | 6/2020 | An | G09G 3/3233 |
| 2020/0176709 | A1* | 6/2020 | Moon | H10K 59/131 |
| 2020/0381486 | A1 | 12/2020 | Jeong et al. | |
| 2021/0125566 | A1* | 4/2021 | Yang | H01L 27/124 |
| 2021/0215982 | A1* | 7/2021 | Ouyang | G03B 30/00 |
| 2021/0357079 | A1* | 11/2021 | Song | G06F 3/0412 |
| 2021/0397320 | A1* | 12/2021 | Ye | G06F 3/0448 |
| 2022/0036822 | A1* | 2/2022 | Li | G02F 1/1362 |
| 2022/0069052 | A1* | 3/2022 | Liu | H10K 59/121 |
| 2022/0075228 | A1* | 3/2022 | Ishikawa | G02F 1/133308 |
| 2022/0137751 | A1* | 5/2022 | Wang | G06F 3/0446 345/173 |
| 2022/0163855 | A1* | 5/2022 | Aoki | G02B 5/005 |
| 2022/0163858 | A1* | 5/2022 | Nishiyama | G09G 3/36 |
| 2022/0253177 | A1* | 8/2022 | Fan | G06F 3/0445 |
| 2022/0352486 | A1* | 11/2022 | Jeon | H10K 50/14 |
| 2023/0014776 | A1* | 1/2023 | Ishikawa | G02F 1/13394 |
| 2023/0031348 | A1* | 2/2023 | Zhang | G06F 3/0418 |
| 2023/0033385 | A1* | 2/2023 | Park | G06F 3/0443 |
| 2023/0152926 | A1* | 5/2023 | Yoshimoto | G06T 7/20 345/175 |
| 2023/0238416 | A1* | 7/2023 | Noudo | H04N 13/243 257/291 |
| 2023/0305653 | A1* | 9/2023 | Li | G06F 3/04164 |
| 2024/0045551 | A1* | 2/2024 | Kim | H10K 59/122 |

FOREIGN PATENT DOCUMENTS

| | | |
|---|---|---|
| CN | 108873512 A | 11/2018 |
| CN | 108878455 A | 11/2018 |
| CN | 109686243 A | 4/2019 |
| CN | 109994534 A | 7/2019 |
| CN | 111223897 A | 6/2020 |
| CN | 111261041 A | 6/2020 |
| CN | 111261797 A | 6/2020 |
| CN | 111538443 A | 8/2020 |
| CN | 112562586 A | 3/2021 |
| CN | 112840302 A | 5/2021 |
| CN | 113241366 A | 8/2021 |
| CN | 113451385 A | 9/2021 |

OTHER PUBLICATIONS

Extended European Search Report dated Jul. 8, 2024; Application No. 22862883.0.

* cited by examiner

TL1

TL2

DISPLAY SUBSTRATE AND DISPLAY DEVICE

CROSS-REFERENCE TO RELATED APPLICATION

This application is the National Stage of International Application No. PCT/CN2022/104153, filed 6 Jul. 2022, which claims priority to and the benefit of Chinese Patent Application No. 202111001585.5, filed 30 Aug. 2021, the entireties of which are hereby incorporated herein by reference.

TECHNICAL FIELD

Embodiments of the present disclosure relate to a display substrate and a display device.

BACKGROUND

User interfaces with touch control function are widely used in various electronic devices, for example, display devices such as mobile phones and tablet computers. A touch control layer configured to achieve the touch control function includes a touch control electrode structure, and the providing of the touch control electrode structure affects the sensitivity and accuracy of the touch control function, so the touch control electrode structure is an important factor affecting user experience.

SUMMARY

At least one embodiment of the disclosure provides a display substrate, comprising a display region and an opening located in the display region, wherein the opening penetrates through the display substrate, and the display substrate comprises: a base substrate, a driving circuit layer, a light-emitting component layer, an encapsulation layer, and a touch control layer; the driving circuit layer is provided on the base substrate and comprising a first signal line at least partially surrounding the opening; the light-emitting component layer is provided on a side of the driving circuit layer away from the base substrate; the encapsulation layer is provided on a side of the light-emitting component layer away from the base substrate; and the touch control layer is provided on a side of the encapsulation layer away from the base substrate and comprising a touch control electrode and a touch control compensation electrode, the touch compensation electrode being electrically connected to the touch control electrode and at least partially surrounding the opening; and the first signal line at least partially overlaps with the touch control compensation electrode in a direction perpendicular to a main surface of the base substrate.

For example, in the display substrate provided by at least one embodiment of the present disclosure, the touch control electrode comprises a first touch control electrode extending along a first direction, and the first touch control electrode comprises a first sub-touch control electrode and a second sub-touch control electrode that are located on opposite sides of the opening in the first direction; the touch control compensation electrode comprises a first touch control compensation electrode, the first touch control compensation electrode comprises a first sub-compensation electrode and a second sub-compensation electrode both extending along an edge of the opening and located on opposite sides of the opening in a second direction, and the first direction intersects with the second direction; and both ends of the first sub-compensation electrode and both ends of the second sub-compensation electrode are electrically connected to the first sub-touch control electrode and the second sub-touch control electrode respectively.

For example, in the display substrate provided by at least one embodiment of the present disclosure, the first touch control compensation electrode further comprises a third sub-compensation electrode located between the first sub-compensation electrode and the second sub-compensation electrode, and the third sub-compensation electrode is electrically connected to the first sub-touch control electrode or the second sub-touch control electrode.

For example, in the display substrate provided by at least one embodiment of the present disclosure, the third sub-compensation electrode is electrically connected to at least one of the first sub-compensation electrode and the second sub-compensation electrode.

For example, in the display substrate provided by at least one embodiment of the present disclosure, the touch control electrode further comprises a second touch control electrode extending along the second direction, and the second touch control electrode comprises a third sub-touch control electrode and a fourth sub-touch control electrode that are located on opposite sides of the opening in the second direction; the touch control compensation electrode comprises a second touch control compensation electrode, and the second touch control compensation electrode comprises a fourth sub-compensation electrode and a fifth sub-compensation electrode both extending along the edge of the opening; and the fourth sub-compensation electrode is electrically connected to the third sub-touch control electrode, and the fifth sub-compensation electrode is electrically connected to the fourth sub-touch control electrode.

For example, in the display substrate provided by at least one embodiment of the present disclosure, the fourth sub-compensation electrode is electrically connected to the fifth sub-compensation electrode.

For example, in the display substrate provided by at least one embodiment of the present disclosure, the touch control electrode comprises a second touch control electrode extending along a second direction, and the second touch control electrode comprises a third sub-touch control electrode first sub-electrode and a third sub-touch control electrode second sub-electrode that are located on opposite sides of the opening in a first direction; the touch control compensation electrode comprises a first touch control compensation electrode, the first touch control compensation electrode comprises a first sub-compensation electrode and a second sub-compensation electrode both extending along an edge of the opening and located on opposite sides of the opening in a second direction, and the first direction intersects with the second direction; and both ends of the first sub-compensation electrode and both ends of the second sub-compensation electrode are electrically connected to the third sub-touch control electrode first sub-electrode and the third sub-touch control electrode second sub-electrode respectively.

For example, in the display substrate provided by at least one embodiment of the present disclosure, the touch control electrode further comprises a first touch control electrode extending along the first direction, and the first touch control electrode comprises a first sub-touch control electrode and a second sub-touch control electrode that are provided adjacent to each other along the second direction; the touch control compensation electrode comprises a second touch control compensation electrode, and the second touch control compensation electrode comprises a fourth sub-compensation electrode and a fifth sub-compensation electrode extending along the edge of the opening; and the fourth sub-compensation electrode is electrically connected to the first sub-touch control electrode, and the fifth sub-compensation electrode is electrically connected to the second sub-touch control electrode.

For example, in the display substrate provided by at least one embodiment of the present disclosure, the fourth sub-compensation electrode comprises a first connection portion for electrical connection, and the fifth sub-compensation electrode comprises a second connection portion for electrical connection; in the direction perpendicular to the main surface of the base substrate, the first connection portion and the first sub-compensation electrode have a first overlapping region, and/or the second connection portion and the second sub-compensation electrode have a second overlapping region.

For example, in the display substrate provided by at least one embodiment of the present disclosure, at least one of the first connection portion and the first sub-compensation electrode is provided with a hollow portion in the first overlapping region, and/or at least one of the second connection portion and the second sub-compensation electrode is provided with a hollow portion in the second overlapping region.

For example, in the display substrate provided by at least one embodiment of the present disclosure, the opening is provided with a center R, and an included angle between a line, which is from any point of an overlapping part of the first connection portion and the first sub-compensation electrode to the center R, and an extension direction of the first connection portion is $\alpha 1$, then $\alpha 1 < 20°$; and/or an included angle between a line, which is from any point of an overlapping part of the second connection portion and the second sub-compensation electrode to the center R, and an extension direction of the second connection portion is $\theta 1$, then $\theta 1 < 20°$.

For example, in the display substrate provided by at least one embodiment of the present disclosure, an overlapping area of the first connection portion and the first sub-compensation electrode is S1, the first sub-compensation electrode is provided with a hollow portion, and an area of the hollow portion of the first sub-compensation electrode is S1', then $0.40 < S1/(S1+S1') < 0.71$; and/or an overlapping area of the second connection portion and the second sub-compensation electrode is S2, the second sub-compensation electrode is provided with a hollow portion, and an area of the hollow portion of the second sub-compensation electrode is S2', then $0.40 < S2/(S2+S2') < 0.71$.

For example, in the display substrate provided by at least one embodiment of the present disclosure, an overlapping area of the first connection portion and the first sub-compensation electrode is S1, the first sub-compensation electrode is provided with a hollow portion, and an area of the hollow portion of the first sub-compensation electrode is S1'; and the opening is provided with a center R, and an included angle between a line, which is from any point of an overlapping part of the first connection portion and the first sub-compensation electrode to the center R, and an extension direction of the first connection portion is $\alpha 1$, then $\alpha 1 < 20°$ and $0.40 < S1/(S1+S1') < 0.71$.

For example, in the display substrate provided by at least one embodiment of the present disclosure, wherein an interlayer insulation layer is provided between the first connection portion and the first sub-compensation electrode, and a material of the interlayer insulation layer is at least one of SiN, SiO, SiON and OC.

For example, in the display substrate provided by at least one embodiment of the present disclosure, wherein the first signal line comprises a first sub-signal line surrounding the opening, and a longitudinal cross-section of the first sub-signal line is provided with at least one bent portion.

For example, in the display substrate provided by at least one embodiment of the present disclosure, the first signal line further comprises a second sub-signal line and a third sub-signal line both surrounding the opening, the first sub-signal line is located on a side of the second sub-signal line away from the base substrate, and the third sub-signal line is located on a side of the first sub-signal line away from the base substrate; and an included angle between a side wall of the third sub-signal line and the main surface of the base substrate is $\alpha 2$, an included angle between a side wall of the first sub-signal line and the main surface of the base substrate is $\alpha 3$, and an included angle between a side wall of the second sub-signal line and the main surface of the base substrate is $\alpha 4$, then $\alpha 3 \leq \alpha 4$ and $\alpha 3 \leq \alpha 2$, where $\alpha 2 < 75°$, $\alpha 3 > 30°$, and $40° < \alpha 4 < 50°$.

For example, in the display substrate provided by at least one embodiment of the present disclosure, a width of an orthographic projection of the first sub-signal line on the base substrate is smaller than a width of an orthographic projection of the third sub-signal line on the base substrate.

For example, in the display substrate provided by at least one embodiment of the present disclosure, an extension length of an orthographic projection of the first sub-signal line on the base substrate is substantially equal to an extension length of an orthographic projection of the third sub-signal line on the base substrate.

For example, in the display substrate provided by at least one embodiment of the present disclosure, a width of an orthographic projection of the first sub-signal line on the base substrate is W1, and W1 ranges from 1.31 μm to 1.71 μm; and a width of an orthographic projection of the third sub-signal line on the base substrate is W2, and W2 ranges from 1.7 μm to 2.3 μm.

For example, in the display substrate provided by at least one embodiment of the present disclosure, an orthographic projection of the first sub-signal line on the base substrate and an orthographic projection of the second sub-signal line on the base substrate have a first overlapping part, and a width of the first overlapping part ranges from 0 μm to 0.1 μm For example, in the display substrate provided by at least one embodiment of the present disclosure, an orthographic projection of the third sub-signal line on the base substrate and an orthographic projection of the second sub-signal line on the base substrate have a second overlapping part, and a width of the second overlapping part ranges from 0.18 μm to 0.30 μm.

For example, in the display substrate provided by at least one embodiment of the present disclosure, the longitudinal cross-section of the first sub-signal line comprises a V-shaped portion and an extension portion located on at least one end of the V-shaped portion, an included angle between a sidewall of the V-shaped portion and the main surface of the base substrate is $\alpha 3$-1, and an included angle between a side of the extension portion close to the base substrate and the main surface of the base substrate is $\alpha 3$-2, then $\alpha 3\text{-}1 > \alpha 3\text{-}2$, where $\alpha 3\text{-}1 < 46°$ and $\alpha 3\text{-}2 > 10°$.

For example, in the display substrate provided by at least one embodiment of the present disclosure, the longitudinal cross-section of the first sub-signal line comprises a V-shaped portion and an extension portion located on at least one end of the V-shaped portion, an included angle between a sidewall of the V-shaped portion and the main surface of the base substrate is α3-1, and an included angle between a side of the extension portion close to the base substrate and the main surface of the base substrate is α3-2, then $$\alpha 3\text{-}1 > \alpha 3\text{-}2, \text{ where } \alpha 3\text{-}1 < 30° \text{ and } \alpha 3\text{-}2 > 15°.$$

For example, in the display substrate provided by at least one embodiment of the present disclosure, the longitudinal cross-section of the first sub-signal line comprises an inclined portion and an extension portion located on at least one end of the inclined portion, an included angle between a sidewall of the inclined portion and the main surface of the base substrate is α3-1, and an included angle between a side of the extension portion close to the base substrate and the main surface of the base substrate is α3-2, then $$\alpha 3\text{-}1 > \alpha 3\text{-}2, \text{ where } \alpha 3\text{-}1 < 30° \text{ and } 0° < \alpha 3\text{-}2 < 10°.$$

For example, in the display substrate provided by at least one embodiment of the present disclosure, the driving circuit layer comprises a plurality of pixel driving circuits, the light-emitting component layer comprises a plurality of light-emitting components, and the plurality of pixel driving circuits are respectively electrically connected to the plurality of light-emitting components to respectively drive the plurality of light-emitting components; the pixel driving circuit comprises a thin film transistor and a storage capacitor, the thin film transistor comprises a gate electrode, a source electrode and a drain electrode provided on the base substrate, the source electrode and drain electrode are provided on a side of the gate electrode away from the base substrate, the storage capacitor comprises a first capacitor electrode and a second capacitor electrode provided on the base substrate, and the second capacitor electrode is provided on a side of the first capacitor electrode away from the base substrate; and the first sub-signal line is provided in a same layer and with a same material as the source electrode and the drain electrode, and the gate electrode is provided in a same layer and with a same material as the first capacitor electrode.

For example, in the display substrate provided by at least one embodiment of the present disclosure, the second sub-signal line is provided in a same layer and with a same material as the gate electrode or the second capacitor electrode.

For example, in the display substrate provided by at least one embodiment of the present disclosure, the pixel driving circuit further comprises a connection electrode provided on a side of the source electrode and the drain electrode away from the base substrate, the light-emitting component is electrically connected to one of the source electrode and the drain electrode through the connection electrode, and the third sub-signal line is provided in a same layer and with a same material as the connection electrode.

For example, in the display substrate provided by at least one embodiment of the present disclosure, the first signal line is electrically connected to the pixel driving circuit and configured to provide a data signal or a scanning signal to the pixel driving circuit.

For example, the display substrate provided by at least one embodiment of the present disclosure, further comprises a light-shielding ring surrounding the opening, and the light-shielding ring is provided in a same layer and with a same material as the touch control layer.

For example, in the display substrate provided by at least one embodiment of the present disclosure, in a direction parallel to the main surface of the base substrate, the light-shielding ring is located on a side of the touch control compensation electrode close to the opening, and the first signal line is provided within a range defined by the touch control compensation electrode and the light-shielding ring.

For example, in the display substrate provided by at least one embodiment of the present disclosure, in the direction perpendicular to the main surface of the base substrate, the first signal line at least partially overlaps with the light-shielding ring.

For example, in the display substrate provided by at least one embodiment of the present disclosure, the light-shielding ring comprises a plurality of light-shielding portions spaced apart from each other.

For example, the display substrate provided by at least one embodiment of the present disclosure, further comprises a detection wire surrounding the opening, wherein the detection wire is electrically connected to the touch control electrode.

For example, in the display substrate provided by at least one embodiment of the present disclosure, the detection wire is provided in a same layer and with a same material as the touch control layer.

For example, in the display substrate provided by at least one embodiment of the present disclosure, the detection wire is at least partially located on a side of the light-shielding ring close to the opening.

For example, the display substrate provided by at least one embodiment of the present disclosure further comprises a barrier dam surrounding the opening, wherein the barrier dam is located on a side of the first signal line close to the opening.

For example, in the display substrate provided by at least one embodiment of the present disclosure, at least part of the barrier dam is provided in a same layer and with a same material as the source electrode and the drain electrode.

For example, in the display substrate provided by at least one embodiment of the present disclosure, the pixel driving circuit further comprises a plurality of insulation sub-layers, and the plurality of insulation sub-layers are respectively provided between the gate electrode and the second capacitor electrode and between the second capacitor electrode and the source electrode as well as the drain electrode; and the display substrate further comprises a groove surrounding the opening, and the groove is located on a side of the first signal line close to the opening, and is at least provided in one of the plurality of insulation sub-layers or the base substrate.

For example, in the display substrate provided by at least one embodiment of the present disclosure, the touch control layer comprises a first touch control metal layer, an interlayer insulation layer and a second touch control metal layer which are sequentially stacked in a direction away from the base substrate, the touch control electrode comprises a first metal line located in the first touch control metal layer and a second metal line located in the second touch control metal layer, a first via hole is provided in the interlayer insulation layer, and the first metal line is electrically connected to the second metal line through the first via hole.

For example, in the display substrate provided by at least one embodiment of the present disclosure, the second metal line is provided with a first slope portion on a side edge of the first metal line, the first slope portion comprises a first sub-slope portion and a second sub-slope portion, and the first sub-slope portion is located on a side of the second sub-slope portion away from the base substrate; and a maximum angle formed between a tangent of any point of the first sub-slope portion and the main surface of the base substrate is α5, and a maximum angle formed between a tangent of any point of the second sub-slope portion and the main surface of the base substrate is α6, then α5>α6, where α5>50° and α6>10°.

For example, in the display substrate provided by at least one embodiment of the present disclosure, α5>α6, α5>70°, and α6>15°.

For example, in the display substrate provided by at least one embodiment of the present disclosure, the second touch control metal layer comprises a stacked structure of titanium layer-aluminum layer-titanium layer or indium tin oxide layer-silver layer-indium tin oxide layer; and the titanium layer or the indium tin oxide layer close to the base substrate forms the maximum angle α5 and the maximum angle α6.

For example, in the display substrate provided by at least one embodiment of the present disclosure, α5 is substantially equal to α3.

or example, in the display substrate provided by at least one embodiment of the present disclosure, the touch control layer further comprises a touch control wire electrically connected to the touch control electrode, the touch control wire comprises a first sub-wire located in the first touch control metal layer and a second sub-wire located in the second touch control metal layer, a second via hole is provided in the interlayer insulation layer, and the first sub-wire is electrically connected to the second sub-wire through the second via hole; the second sub-wire is provided with a second slope portion on a side edge of the first sub-wire, the second slope portion comprises a third sub-slope portion and a fourth sub-slope portion, and the third sub-slope portion is located on a side of the fourth sub-slope portion away from the base substrate; and a maximum angle formed between a tangent of any point of the third sub-slope portion and the main surface of the base substrate is α7, and a maximum angle formed between a tangent of any point of the fourth sub-slope portion and the main surface of the base substrate is α8, then α7>α8, where α7>50° and α8>10°.

At least one embodiment of the disclosure further provides a display device, the display device comprises the display substrate provided by the embodiments of the present disclosure.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
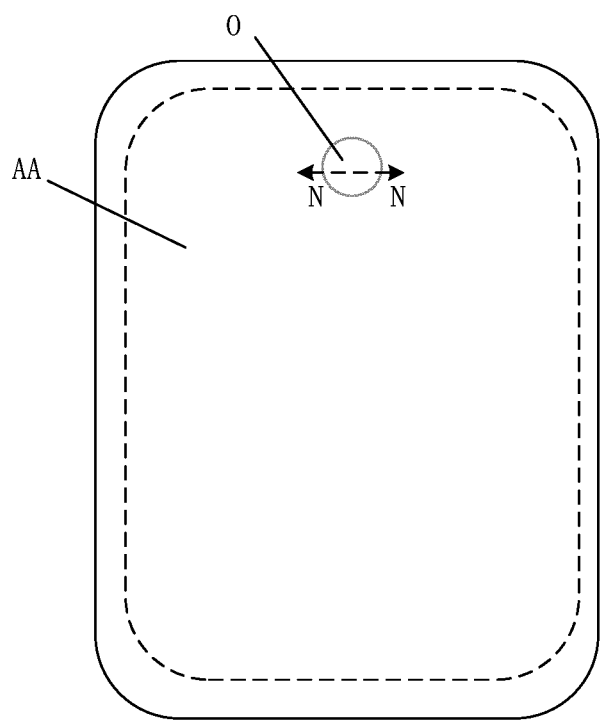
FIG. 1 is a schematic plan view of a display substrate provided by at least one embodiment of the present disclosure.

FIG. 1 illustrates a schematic plan view of a display substrate provided by at least one embodiment of the present disclosure. As illustrated in FIG. 1, in order to enable the display substrate with a large screen, an opening O is provided in the display region AA of the display substrate, and the functional elements, such as cameras, are provided at the position corresponding to the opening O, thereby reducing the space for arranging functional elements and increasing a display region AA of the display substrate, and thus increasing the screen-to-body ratio of the display substrate.

Figure 2:
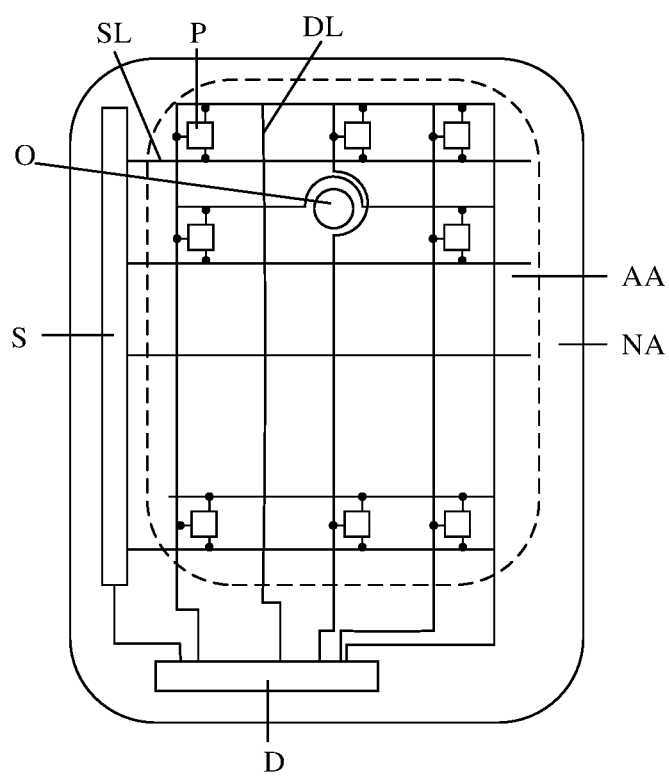
FIG. 2 is another schematic plan view of a display substrate provided by at least one embodiment of the present disclosure.

For example, FIG. 2 illustrates another schematic plan view of a display substrate provided by at least one embodiment of the present disclosure. As illustrated in FIG. 2, the display substrate includes a plurality of sub-pixels P in the display region AA, and includes driving circuits such as a scan driving circuit S and a data driving circuit D in a peripheral region NA. For example, the plurality of sub-pixels P are respectively connected to the scan driving circuit S through a plurality of scan lines SL, and are respectively connected to the data driving circuit D through a plurality of data lines DL, so that the plurality of sub-pixels P can be driven by the scan driving circuit S and the data driving circuit D, etc. to achieve the display. For example, as illustrated in FIG. 2, the scan line SL and the data line DL cannot pass through straightly at the location of an opening O because of the opening arranged in the display region AA, so in some embodiments, the scan line SL and data line DL can be wired in a winding manner.

For example, each sub-pixel P includes a light-emitting component and a pixel driving circuit for driving the light-emitting component, and the pixel driving circuit can receive electrical signals such as scan signals and data signals transmitted from the scan driving circuit S and the data driving circuit D to drive the light-emitting component. For example, FIG. 3 illustrates an equivalent circuit diagram of a pixel driving circuit.

Figure 3:
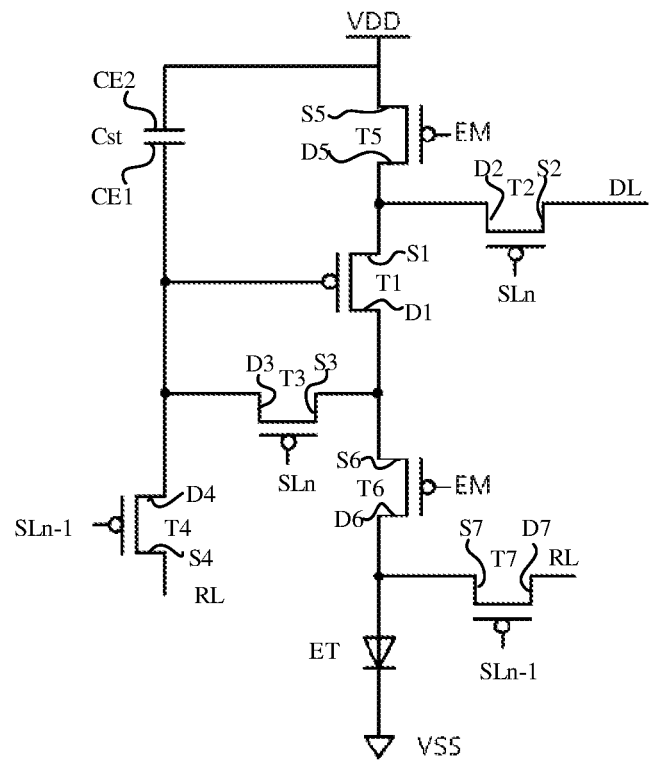
FIG. 3 is a schematic diagram of a pixel driving circuit of a display substrate provided by at least one embodiment of the present disclosure.

For example, as illustrated in FIG. 3, in this example, the pixel driving circuit is a pixel driving circuit with a 7T1C structure, including: a plurality of thin film transistors T1, T2, T3, T4, T5, T6 and T7, a plurality of signal lines connected to the plurality of thin film transistors T1, T2, T3, T4, T5, T6 and T7, and a storage capacitor Cst; the plurality of signal lines include a scan line SL, a light-emitting control line EM, an initialization line RL, a data line DL and a first power supply line VDD. For example, the scan line SL includes a first scan line SLn and a second scan line SLn−1, for example, the first scan line SLn is configured to transmit a gate scan signal, the second scan line SLn−1 is configured to transmit a reset signal, and the light-emitting control line EM is configured to transmit a light-emitting control signal.

It should be noted that, in other examples, the pixel driving circuit may also adopt other types of circuit structures, such as a 2T1C structure, a 7T2C structure or a 9T2C structure, etc., which is not limited in the embodiments of the present disclosure.

For example, as illustrated in FIG. 3, a first gate electrode G1 of a first thin film transistor T1 is electrically connected to a third drain electrode D3 of a third thin film transistor T3 and a fourth drain electrode D4 of a fourth thin film transistor T4. A first source electrode S1 of the first thin film transistor T1 is electrically connected to a second drain electrode D2 of a second thin film transistor T2 and a fifth drain electrode D5 of a fifth thin film transistor T5. A first drain electrode D1 of the first thin film transistor T1 is electrically connected to a third source electrode S3 of the third thin film transistor T3 and a sixth source electrode S6 of a sixth thin film transistor T6.

For example, as illustrated in FIG. 3, a second gate electrode G2 of the second thin film transistor T2 is configured to be electrically connected to the first scan line SLn to receive a gate scan signal, a second source electrode S2 of the second thin film transistor T2 is configured to be electrically connected to the data line DL to receive a data signal, and the second drain electrode D2 of the second thin film transistor T2 is electrically connected to the first source electrode S1 of the first thin film transistor T1.

For example, as illustrated in FIG. 3, a third gate electrode G3 of the third thin film transistor T3 is configured to be electrically connected to the first scan line SLn, the third source electrode S3 of the third thin film transistor T3 is electrically connected to the first drain electrode D1 of the first thin film transistor T1, and the third drain electrode D3 of the third thin film transistor T3 is electrically connected to the first gate electrode G1 of the first thin film transistor T1.

For example, as illustrated in FIG. 3, a fourth gate electrode G4 of the fourth thin film transistor T4 is configured to be electrically connected to the second scan line SLn−1 to receive a reset signal, a fourth source electrode S4 of the fourth thin film transistor T4 is configured to be electrically connected to the initialization line RL to receive an initialization signal, and the fourth drain electrode D4 of the fourth thin film transistor T4 is electrically connected to the first gate electrode G1 of the first thin film transistor T1.

For example, as illustrated in FIG. 3, a fifth gate electrode G5 of the fifth thin film transistor T5 is configured to be electrically connected to the light-emitting control line EM to receive a light-emitting control signal, a fifth source electrode S5 of the fifth thin film transistor T5 is configured to be electrically connected to the first power supply line VDD to receive a first power supply signal, and the fifth drain electrode D5 of the fifth thin film transistor T5 is electrically connected to the first source electrode S1 of the first thin film transistor T1.

For example, as illustrated in FIG. 3, a sixth gate electrode G6 of the sixth thin film transistor T6 is configured to be electrically connected to the light-emitting control line EM to receive a light-emitting control signal, the sixth source electrode S6 of the sixth thin film transistor T6 is electrically connected to the first drain electrode D1 of the first thin film transistor T1, and a sixth drain electrode D6 of the sixth thin film transistor T6 is electrically connected to a first electrode (e.g., an anode) of a light-emitting component ET.

For example, as illustrated in FIG. 3, a seventh gate electrode G7 of the seventh thin film transistor T7 is configured to be electrically connected to the second scan line SLn−1 to receive a reset signal, a seventh source electrode S7 of the seventh thin film transistor T7 is electrically connected to the first electrode (e.g., an anode) of the light-emitting component ET, and a seventh drain electrode D7 of the seventh thin film transistor T7 is configured to be electrically connected to the initialization line RL to receive an initialization signal. For example, the seventh drain electrode D7 of the seventh thin film transistor T7 is electrically connected to the fourth source electrode S4 of the fourth thin film transistor T4 to achieve the electrical connection to the initialization line RL.

For example, as illustrated in FIG. 3, the storage capacitor Cst includes a first capacitor electrode CE1 and a second capacitor electrode CE2. The second capacitor electrode CE2 is electrically connected to the first power supply line VDD, and the first capacitor electrode CE1 is electrically connected to the first gate electrode G1 of the first thin film transistor T1 and the third drain electrode D3 of the third thin film transistor T3.

For example, as illustrated in FIG. 3, the second electrode (e.g., a cathode) of the light-emitting component ET is electrically connected to the second power supply line VSS.

It should be noted that one of the first power supply line VDD and the second power line supply VSS is a power supply line providing a high voltage, and the other is a power supply line providing a low voltage. For example, in the example illustrated in FIG. 3, the first power supply line VDD provides a constant first voltage, and the first voltage is a positive voltage; and the second power supply line VSS provides a constant second voltage, and the second voltage is a negative voltage, etc. For example, in some examples, the second voltage is a grounded voltage.

It should be noted that the above-mentioned reset signal and the above-mentioned initialization signal may be the same signal.

In addition, the transistor can be categorized into an N-type transistor and a P-type transistor according to characteristics of the transistors. For the sake of clarity, the embodiments of the present disclosure take the case where all the transistors are P-type transistors (for example, P-type thin film transistors) as an example to illustrate the technical solutions of the present disclosure in detail, that is, in the description of the present disclosure, the first transistor T1, the second transistor T2, the third transistor T3, the fourth transistor T4, the fifth transistor T5, the sixth transistor T6 and the seventh transistor T7, etc. are all P-type transistors. However, the transistors in the embodiments of the present disclosure are not limited to P-type transistors, and those skilled in the art can adopt N-type transistors (e.g., N-type thin film transistors) to implement the functions of one or more transistors in the embodiments of the present disclosure according to actual requirements.

It should be noted that the transistors used in the embodiments of the present disclosure may be thin film transistors, field effect transistors or other switching components with the same characteristics, and the thin film transistors may include oxide semiconductor thin film transistors, amorphous silicon thin film transistors or polysilicon thin film transistors, etc. A source electrode and a drain electrode of a transistor may be symmetrical in structure, so the source electrode and drain electrode of the transistor may be same in physical structure, and the source electrodes and drain electrodes of all or some of the transistors in the embodiments of the present disclosure are interchangeable as needed.

Figure 4:
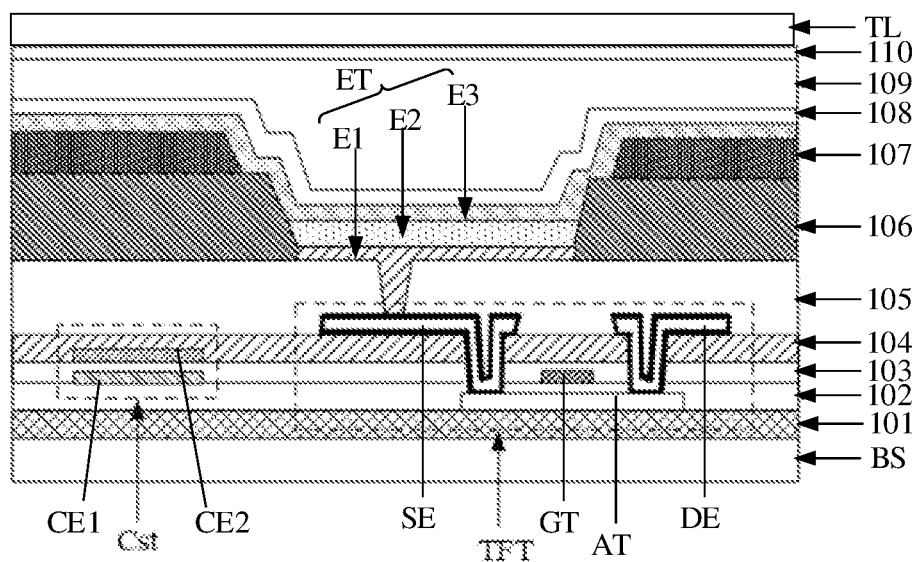
FIG. 4 is a schematic partial cross-sectional view of a sub-pixel of a display substrate provided by at least one embodiment of the present disclosure.

For example, FIG. 4 illustrates a schematic cross-sectional view of a sub-pixel in a display substrate provided by at least one embodiment of the present disclosure. For example, the thin film transistor illustrated in FIG. 4 is the seventh thin film transistor T7 in FIG. 3. As illustrated in FIG. 4, the display substrate includes a base substrate BS, a driving circuit layer provided on the base substrate BS, a light-emitting component layer provided on the driving circuit layer, and an encapsulation layer provided on the light-emitting component layer. The driving circuit layer includes a plurality of pixel driving circuits for a plurality of sub-pixels, the light-emitting component layer includes a plurality of light-emitting components ET for the plurality of sub-pixels, and the plurality of pixel driving circuits are respectively electrically connected to the plurality of light-emitting components to respectively drive the plurality of light-emitting components ET.

For example, each pixel driving circuit includes a thin film transistor TFT, a storage capacitor Cst, or other structures. As illustrated in FIG. 4, the encapsulation layer includes, for example, a plurality of encapsulation sub-layers 108/109/110. For example, in some examples, the encapsulation sub-layers 108 and 110 are inorganic encapsulation layers, the encapsulation sub-layer 109 is an organic encapsulation layer, thereby forming a composite encapsulation layer, which can achieve effective encapsulation of the display substrate.

For example, as illustrated in FIG. 4, the thin film transistor TFT includes an active layer AT, a gate electrode GT, a source electrode SE and a drain electrode DE, and the storage capacitor Cst includes a first capacitor electrode CE1 and a second capacitor electrode CE2. For example, the first capacitive electrode CE1 is provided in the same layer and with the same material as the gate electrode GT, and the second capacitor electrode CE2 is provided on a side of the first capacitor electrode CE1 away from the base substrate.

It should be noted that, in the embodiments of the present disclosure, "provided in the same layer and with the same material" means that two functional layers or structural layers are formed in the same layer and made from the same material in the hierarchical structure of the display substrate, that is, in the manufacturing process, the two functional layers or structural layers can be made from the same material layer, and the required pattern and structure can be formed through one single patterning process.

For example, as illustrated in FIG. 4, the display substrate further includes a buffer layer 101 provided on the base substrate BS, a first gate insulation layer 102 provided on the active layer AT, a second gate insulation layer 103 provided on the gate electrode GT and the first capacitor electrode CE1, an interlayer insulation layer 104 provided on the second capacitor electrode CE2, and insulation layers such as a planarization layer 105, etc. provided on the source electrode SE and the drain electrode DE.

For example, as illustrated in FIG. 4, the light-emitting component ET includes a first electrode (e.g., an anode) E1, a second electrode (e.g., a cathode) E3, and a light-emitting layer E2 between the first electrode E1 and the second electrode E3. For example, the planarization layer 105 is provided with a via hole, and the first electrode E1 is electrically connected to the source electrode SE of the thin film transistor through the via hole in the planarization layer 105, so that the first electrode E1 can receive electrical signals from the source electrode SE of the thin film transistor.

For example, as illustrated in FIG. 4, a pixel defining layer 106 is further provided on the first electrode E1, the pixel defining layer 106 is provided with a sub-pixel opening for exposing the first electrode E1, and the light-emitting layer E2 and the second electrode E3 are at least provided in the sub-pixel opening, and thus the sub-pixel opening defines a light-emitting region of the sub-pixel. For example, a spacer 107 is further provided on the pixel defining layer 106, and the above-mentioned encapsulation layer is provided on the spacer 107.

Figure 5:
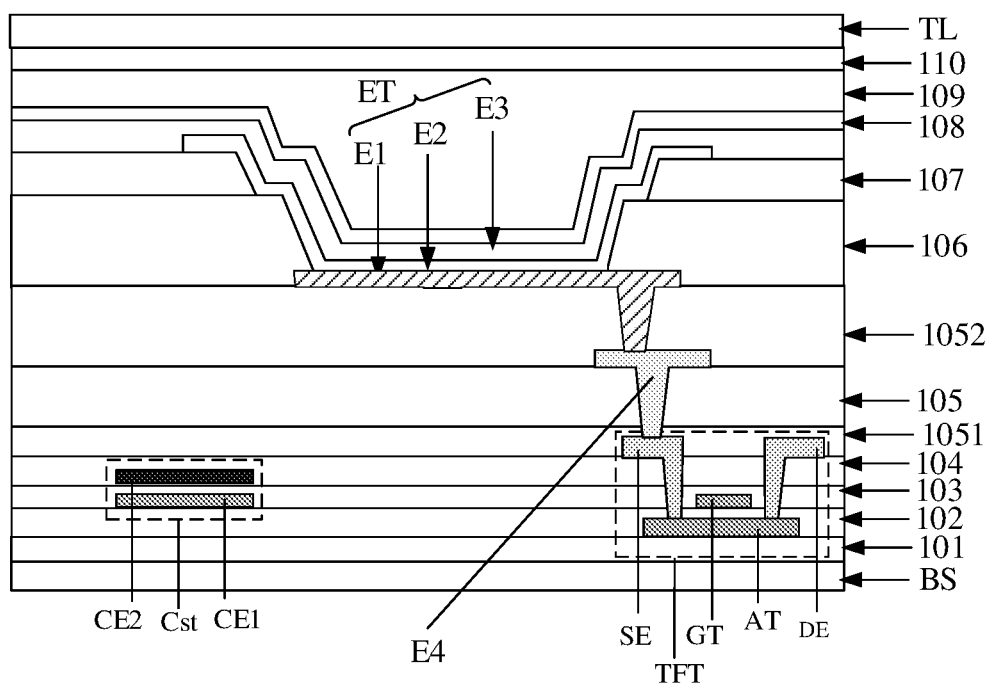
FIG. 5 is another schematic partial cross-sectional view of a sub-pixel of a display substrate provided by at least one embodiment of the present disclosure.

For example, FIG. 5 illustrates another schematic cross-sectional view of a sub-pixel in a display substrate provided by at least one embodiment of the present disclosure. Different from FIG. 4, in the example illustrated in FIG. 5, the display substrate further includes a connection electrode E4, the first electrode E1 of the light-emitting component ET is connected to the source electrode SE of the thin film transistor TFT through the connection electrode E4. In this case, the display substrate further includes a passivation layer 1051 provided on the source electrode SE and the drain electrode DE, a planarization layer 105 is provided on the passivation layer 1051, and another planarization layer 1052 is provided on the planarization layer 105. For example, the planarization layer 1052 is provided with a via hole, the first electrode E1 is electrically connected to the connection electrode E4 through the via hole in the planarization layer 1052, the passivation layer 1051 and the planarization layer 105 are respectively provided with a via hole penetrating through them, and the connection electrode E4 is electrically connected to the source electrode SE of the thin film transistor TFT through the via holes in the passivation layer 1051 and the planarization layer 105.

For example, in some other embodiments, the display substrate may also not include the passivation layer 1051 in FIG. 5, in this case, the connection electrode E4 is electrically connected to the source electrode SE of the thin-film transistor TFT directly through the via hole in the planarization layer 105.

For example, in some embodiments, as illustrated in FIG. 4 and FIG. 5, a touch control layer TL is further provided on the display substrate to enable the display substrate to achieve a touch control function.

Figure 6:
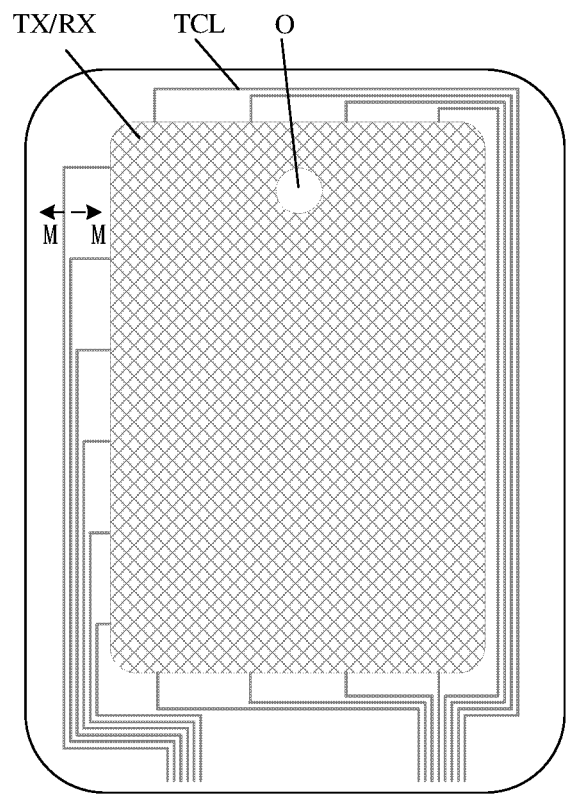
FIG. 6 is a schematic plan view of a touch control layer of a display substrate provided by at least one embodiment of the present disclosure.

For example, FIG. 6 illustrates a schematic plan view of a touch control layer. As illustrated in FIG. 6, in some embodiments, the touch control layer includes touch control electrodes TX/RX and touch control wires TCL connected to the touch control electrodes TX/RX. For example, the part corresponding to the opening O in the touch control layer is removed to facilitate the arrangement of functional components such as a camera.

For example, in the display substrate with the above-mentioned touch control layer, the existence of the opening O will affect the arrangement of signal lines such as the scan line SL and the data line DL near the opening O on the display substrate, and will also affect the arrangement of the touch control electrodes TX/RX near the opening O. In this regard, how to arrange the structure of the signal lines and the touch control electrodes near the opening is the key issue to form a good touch control effect and display effect.

At least one embodiment of the present disclosure provides a display substrate and a display device. The display substrate is provided with a display region and an opening located in the display region, and the opening penetrates through the display substrate. The display substrate includes a base substrate, a driving circuit layer, a light-emitting component layer, an encapsulation layer, and a touch control layer. The driving circuit layer is provided on the base substrate and includes a first signal line at least partially surrounding the opening; the light-emitting component layer is provided on a side of the driving circuit layer away from the base substrate; the encapsulation layer is provided on a side of the light-emitting component layer away from the base substrate; and the touch control layer is provided on a side of the encapsulation layer away from the base substrate and includes a touch control electrode and a touch control compensation electrode, the touch control compensation electrode is electrically connected to the touch control electrode and at least partially surrounding the opening; and the first signal line at least partially overlaps with the touch control compensation electrode in a direction perpendicular to a main surface of the base substrate.

In the embodiments of the present disclosure, the first signal line at least partially overlapping with the touch control compensation electrode can reduce the space occupied by the first signal line and the touch control compensation electrode on the display substrate as a whole, thereby facilitating the large-screen design of the display substrate.

The display substrate and display device of the present disclosure will be described below by several specific embodiments.

At least one embodiment of the present disclosure provides a display substrate. Referring to FIG. 1, the display substrate is provided with a display region AA and an opening O located in the display region AA, and the opening O penetrates through the display substrate. Referring to FIG. 4 and FIG. 5, the display substrate includes a base substrate BS, a driving circuit layer, a light-emitting component layer, an encapsulation layer, and a touch control layer TL. The driving circuit layer is provided on the base substrate BS and includes structures such as a thin film transistor TFT, a storage capacitor Cst, and a first signal line L1 (referring to FIG. 16, which will be introduced later) at least partially surrounding the opening O; the light-emitting component layer is provided on a side of the driving circuit layer away from the base substrate BS and includes a plurality of light-emitting components ET; the encapsulation layer is provided on a side of the light-emitting component layer away from the base substrate BS, such as a composite encapsulation layer, and includes a plurality of encapsulation sub-layers 108/109/110; the touch control layer TL is provided on a side of the encapsulation layer away from the base substrate BS for achieving the touch control function.

Figure 7:
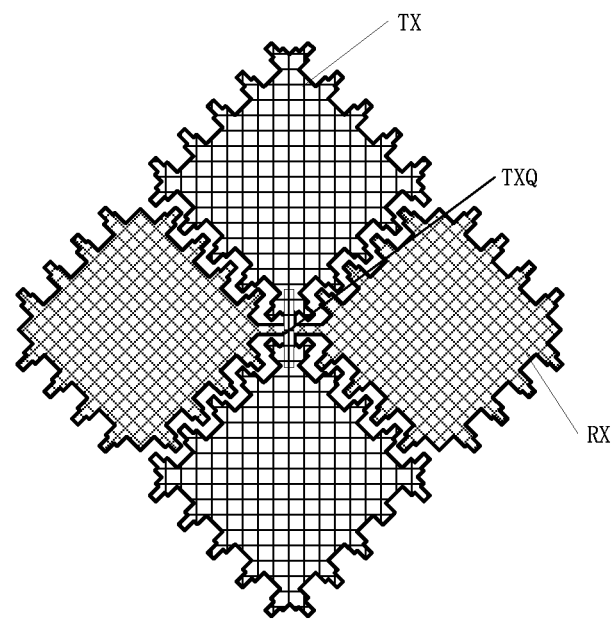
FIG. 7 is a schematic partial plan view of a touch control layer of a display substrate provided by at least one embodiment of the present disclosure.

For example, FIG. 7 illustrates a schematic partial plan view of the touch control layer TL. As illustrated in FIG. 7, the touch control layer TL includes a touch control electrode, and the touch control electrode indirectly contacting with the opening O is substantially in a shape of rectangular block to improve the stability of the touch control function. For example, as illustrated in FIG. 7, the touch control electrode includes a first touch control electrode TX extending along a first direction (for example, the vertical direction in the figure) and a second touch control electrode RX extending along a second direction (for example, the horizontal direction in the figure). The first direction intersects with the second direction, for example, the first direction is perpendicular to the second direction. In the example illustrated in FIG. 7, the adjacent first touch control electrodes TX are electrically connected to each other at the intersection of the first touch control electrode TX and the second touch control electrode RX, for example, by using a bridge electrode TXQ.

It should be noted that, in some embodiments, the arrangement of the first touch control electrodes TX and the second touch control electrodes RX may be interchanged, and the embodiments of the present disclosure do not specifically limit the arrangement of the first touch control electrodes TX and the second touch control electrodes RX.

Figure 8:
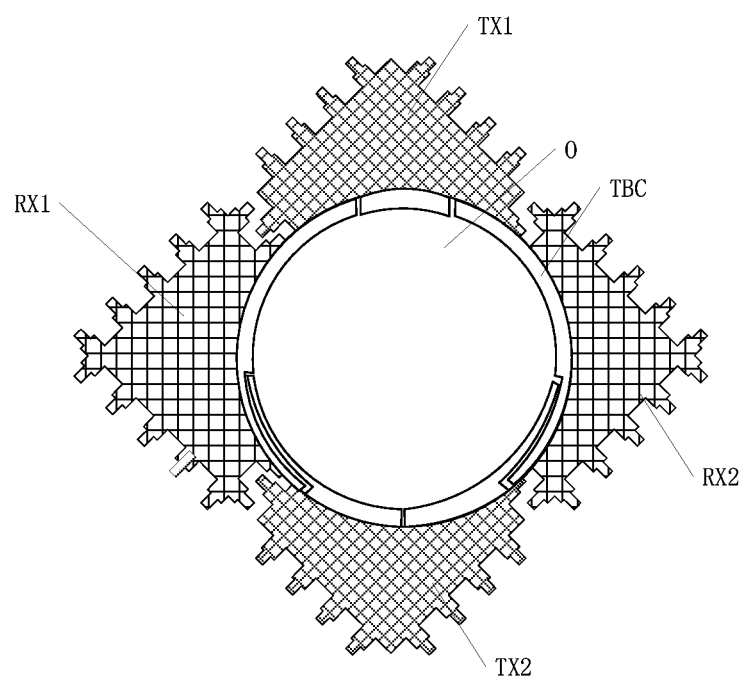
FIG. 8 is a schematic partial plan view, near an opening, of a touch control layer of a display substrate provided by at least one embodiment of the present disclosure.

For example, FIG. 8 illustrates a schematic partial plan view of the touch control layer TL at the position of the opening O. As illustrated in FIG. 8, at the position of the opening O, the touch control electrode is no longer a complete rectangular block, and part of the first touch control electrode TX or the second touch control electrode RX corresponding to the opening O is removed. In order to connect adjacent first touch control electrodes TX or adjacent second touch control electrodes RX, and also to compensate the incomplete touch control electrode so that its signal transmission performance is substantially the same as that of the complete touch control electrode to ensure the touch consistency of the touch control layer, the touch control compensation electrode TBC is provided around the opening O.

Figure 16:
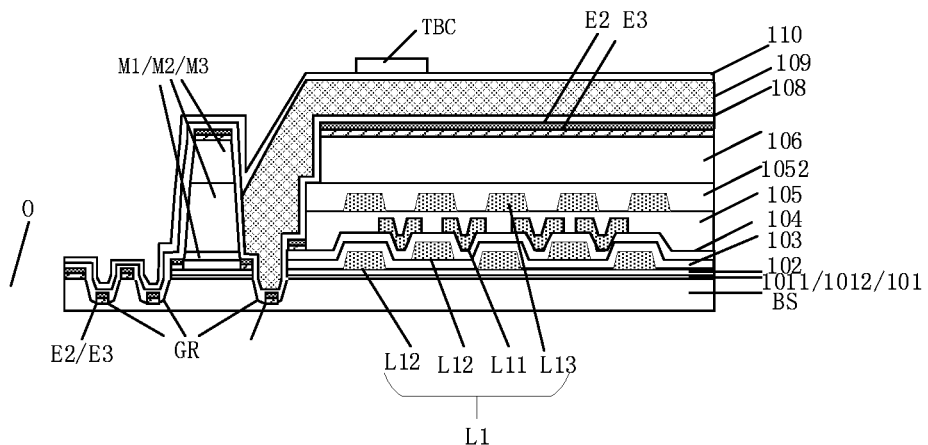
FIG. 16 is a schematic cross-sectional view of the display substrate in FIG. 1 along a line N-N.

For example, in some embodiments, as illustrated in FIG. 8, the touch control layer TL further includes the touch control compensation electrode TBC electrically connected to the touch control electrodes and at least partially surrounding the opening O. For example, in the direction perpendicular to the main surface of the base substrate BS, the first signal line L1 at least partially overlaps with the touch control compensation electrode TBC, as illustrated in FIG. 16. As a result, the winding arrangement of the first signal line on the display substrate and the touch control compensation electrode in the touch control layer occupy substantially the same space on the display substrate, thereby reducing the space occupied by the first signal line and the touch control compensation electrode on the display substrate as a whole, which in turn facilitates the large-screen design of the display substrate.

Figure 9A:
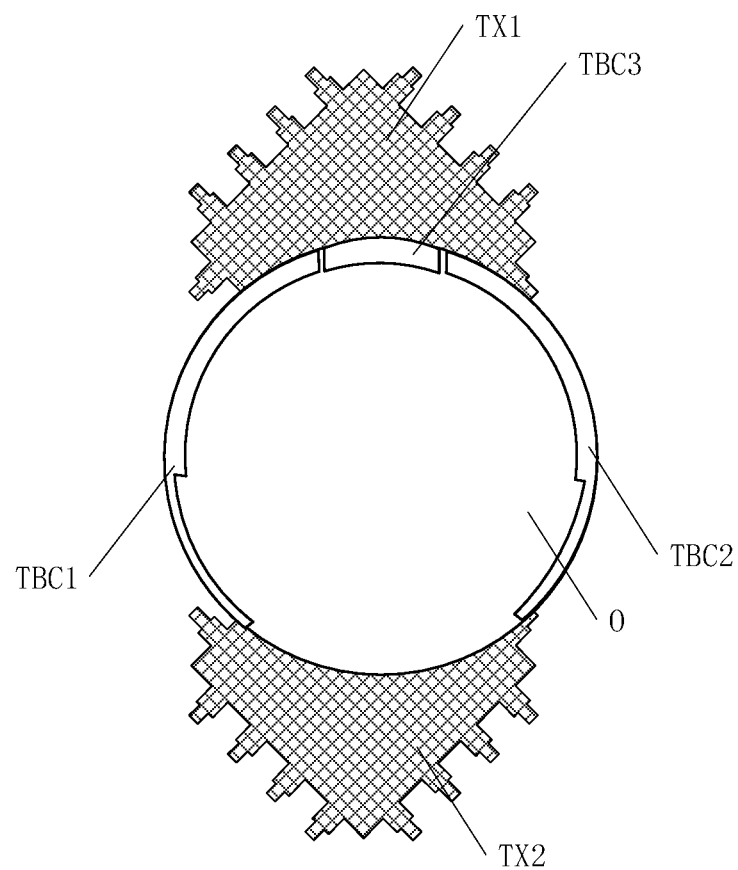
FIG. 9A is a schematic partial plan view, near an opening, of a first touch control electrode in a touch control layer of a display substrate provided by at least one embodiment of the present disclosure.
Figure 9B:
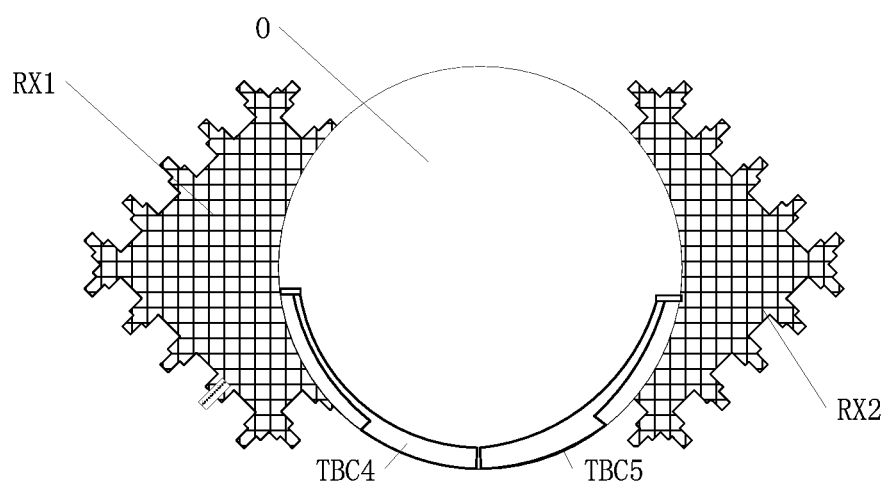
FIG. 9B is a schematic partial plan view, near an opening, of a second touch control electrode in a touch control layer of a display substrate provided by at least one embodiment of the present disclosure.

For example, FIG. 9A illustrates a schematic diagram of the connection between the first touch control electrode and the touch control compensation electrode, and FIG. 9B illustrates a schematic diagram of the connection between the second touch control electrode and the touch control compensation electrode.

For example, referring to FIG. 8 and FIG. 9A, the first touch control electrode TX includes a first sub-touch control electrode TX1 and a second sub-touch control electrode TX2 that are located on opposite sides (here, the upper and lower sides) of the opening O in the first direction. The touch control compensation electrode TBC includes a first touch control compensation electrode, and the first touch control compensation electrode includes a first sub-compensation electrode TBC1 and a second sub-compensation electrode TBC2 both extending along an edge of the opening O and located on opposite sides (here, the left and right sides) of the opening O in the second direction. Both ends of the first sub-compensation electrode TBC1 and both ends of the second sub-compensation electrode TBC2 are electrically connected to the first sub-touch control electrode TX1 and the second sub-touch control electrode TX2 respectively, thereby electrically connecting the first sub-touch control electrode TX1 and the second sub-touch control electrode TX2, and compensating for changes in the signal transmission characteristics of the first sub-touch control electrode TX1 and the second sub-touch control electrode TX2 due to partial absence, such as changes in signal transmission speed, etc., which may be generated due to the changes in resistance or capacitance of the first sub-touch control electrode TX1 and the second sub-touch control electrode TX2.

For example, in some embodiments, as illustrated in FIG. 9A, the first touch control compensation electrode further includes a third sub-compensation electrode TBC3 located between the first sub-compensation electrode TBC1 and the second sub-compensation electrode TBC2, and the third sub-compensation electrode TBC3 is electrically connected to the first sub-touch control electrode TX1 (the case illustrated in the figure) or the second sub-touch control electrode TX2 to further compensate the first sub-touch control electrode TX1 or the second sub-touch control electrode TX2. For example, in some examples, the third sub-compensation electrode TBC3 is electrically connected to at least one of the first sub-compensation electrode TBC1 and the second sub-compensation electrode TBC2, thereby providing a compensation effect together with the first sub-compensation electrode TBC1 or the second sub-compensation electrode TBC2.

In the above-mentioned embodiments, the opening O is basically opened at a center of the intersection of the first touch control electrode TX and the second touch control electrode RX. In other embodiments, if the opening O is not opened at a center of the intersection of the first touch control electrode TX and the second touch control electrode RX, the third sub-compensation electrode TBC3 can be used to further compensate more part of the touch control electrode that is dug out due to the opening.

For example, in some embodiments, if the first touch control electrode TX and/or the second touch control electrode RX further include a dummy electrode, the third sub-compensation electrode TBC3 may be connected to both the dummy electrode and the compensation electrode, thereby obtaining a larger area of the electrode while further extending the compensation range of the compensation electrode.

For example, in some embodiments, referring to FIG. 8 and FIG. 9B, the second touch control electrode RX includes a third sub-touch control electrode RX1 and a fourth sub-touch control electrode RX2 that are located on opposite sides (here, the left and right sides) of the opening O in the second direction; the touch control compensation electrode TBC includes a second touch control compensation electrode, and the second touch control compensation electrode includes a fourth sub-compensation electrode TBC4 and a fifth sub-compensation electrode TBC5 both extending along the edge of the opening O. For example, in the example illustrated in FIG. 9B, both the fourth sub-compensation electrode TBC4 and the fifth sub-compensation electrode TBC5 are provided on the same side of the opening O in the first direction. In other embodiments, the fourth sub-compensation electrode TBC4 and the fifth sub-compensation electrode TBC5 may also be respectively provided on opposite sides of the opening O in the first direction.

For example, as illustrated in FIG. 9B, the fourth sub-compensation electrode TBC4 is electrically connected to the third sub-touch control electrode RX1, and the fifth sub-compensation electrode TBC5 is electrically connected to the fourth sub-touch control electrode RX2. For example, the fourth sub-compensation electrode TBC4 is electrically connected to the fifth sub-compensation electrode TBC5 so as to electrically connect the third sub-touch control electrode RX1 with the fourth sub-touch control electrode RX2.

For example, in some examples, the fourth sub-compensation electrode TBC4 and the fifth sub-compensation electrode TBC5 may be connected directly or may also be electrically connected through other structures, and the connection manner of the fourth sub-compensation electrode TBC4 and the fifth sub-compensation electrode TBC5 can be set as needed.

In the example illustrated in FIG. 9B, the fourth sub-compensation electrode TBC4 and the fifth sub-compensation electrode TBC5 are easy to adjust the capacitance value of compensation, and on the other hand, they can also avoid the problem of electrostatic accumulation caused by long straight wires, so that a better touch control effect can be achieved.

For example, in some other embodiments, the opening O is immediately opened on only one sub-electrode of the first touch control electrode TX or opened on only one sub-electrode of the second touch control electrode RX, and the following is described by taking the case where the opening O is opened on the third sub-touch control electrode RX1 of one second touch control electrode RX as an example.

Figure 10A:
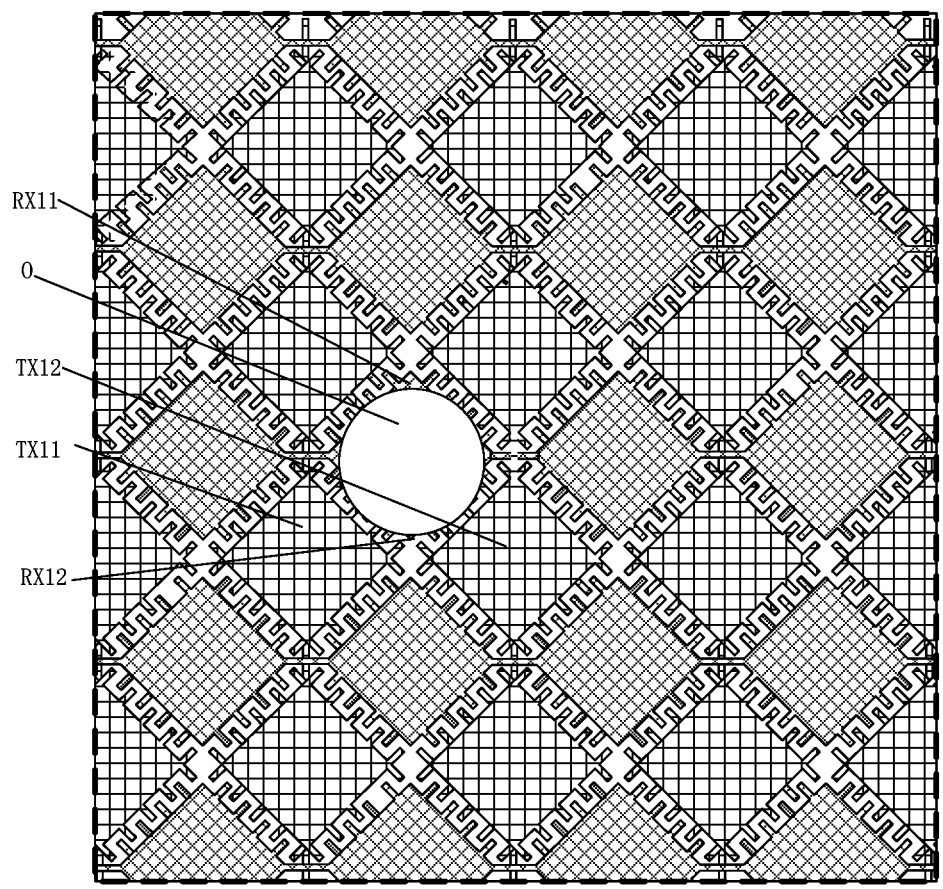
FIG. 10A is a schematic partial plan view, near an opening, of a first touch control electrode and a second touch control electrode in a touch control layer of a display substrate provided by at least one embodiment of the present disclosure.

For example, as illustrated in FIG. 10A, the second touch control electrode RX includes a third sub-touch control electrode first sub-electrode RX11 and a third sub-touch control electrode second sub-electrode RX12 that are located on opposite sides of the opening O in the first direction. In this case, as illustrated in FIG. 10B, the touch control compensation electrode TBC includes a first touch control compensation electrode, the first touch control compensation electrode includes a first sub-compensation electrode TBC11 and a second sub-compensation electrode TBC12 both extending along an edge of the opening O and located on opposite sides of the opening O in the second direction, and both ends of the first sub-compensation electrode TBC11 and both ends of the second sub-compensation electrode TBC12 are electrically connected to the third sub-touch control electrode first sub-electrode RX11 and the third sub-touch control electrode second sub-electrode RX12 respectively.

Figure 10B:
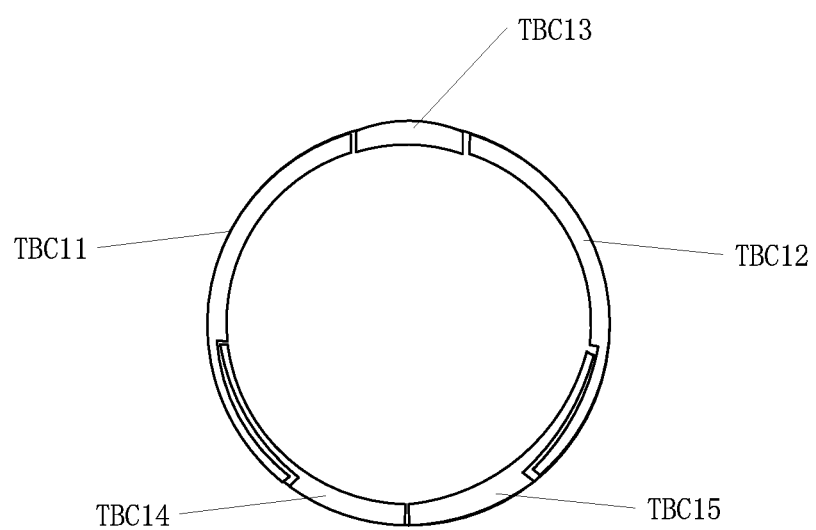
FIG. 10B is a schematic partial plan view, near an opening, of a touch control compensation electrode of a first touch control electrode and a second touch control electrode in a touch control layer of a display substrate provided by at least one embodiment of the present disclosure.

For example, as illustrated in FIG. 10B, the first touch control compensation electrode further includes a third sub-compensation electrode TBC13 located between the first sub-compensation electrode TBC11 and the second sub-compensation electrode TBC12, and the third sub-compensation electrode TBC13 is electrically connected to the third sub-touch control electrode first sub-electrode RX11 or the third sub-touch control electrode second sub-electrode RX12 to further compensates the third sub-touch control electrode first sub-electrode RX11 or the third sub-touch control electrode second sub-electrode RX12. For example, in some examples, the third sub-compensation electrode TBC13 may also be electrically connected to at least one of the first sub-compensation electrode TBC11 and the second sub-compensation electrode TBC12, thereby providing a compensation effect together with the first sub-compensation electrode TBC11 or the second sub-compensation electrode TBC12.

For example, as illustrated in FIG. 10A, the first touch control electrode TX includes a first sub-touch control electrode TX11 and a second sub-touch control electrode TX12 that are provided adjacent to each other along the second direction. In this case, as illustrated in FIG. 10B, the touch control compensation electrode TBC includes a second touch control compensation electrode, and the second touch control compensation electrode includes a fourth sub-compensation electrode TBC14 and a fifth sub-compensation electrode TBC15 extending along the edge of the opening O. The fourth sub-compensation electrode TBC14 is electrically connected to the first sub-touch control electrode TX11, and the fifth sub-compensation electrode TBC15 is electrically connected to the second sub-touch control electrode TX12.

Therefore, in the above-mentioned embodiment, the first sub-compensation electrode TBC11 and/or the second sub-compensation electrode TBC12 are connected to an upper half and a lower half of the same diamond-shaped third sub-touch control electrode, while the fourth sub-compensation electrode TBC14 and the fifth sub-compensation electrode TBC15 are respectively connected to the left and right diamond-shaped sub-touch control electrodes of the first touch control electrodes TX. In this case, the fourth sub-compensation electrode TBC14 compensates the sub-touch control electrode on the left side of the opening O, and the second sub-compensation electrodes TBC15 compensates the sub-touch control electrode on the right side of the opening O.

Similarly, in the case where the opening O is opened on the only one sub-electrode of one first touch control electrode TX, the compensation electrode can also be provided in the above-mentioned manner, which will not be repeated here.

For example, in some other embodiments, the touch control compensation electrode TBC may also have other structures, and the embodiments of the present disclosure do not limit the specific structure of the touch control compensation electrode TBC. For example, FIG. 11 illustrates another schematic structure of the touch control compensation electrode TBC.

Figure 11:
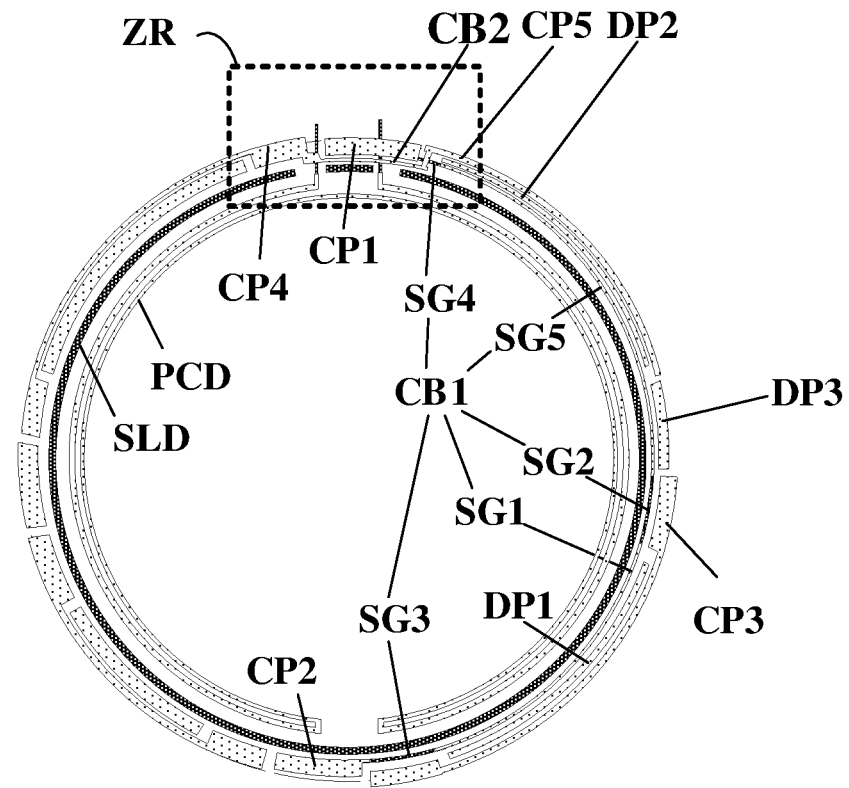
FIG. 11 is another schematic partial plan view, near an opening, of a touch control layer of a display substrate provided by at least one embodiment of the present disclosure.

For example, as illustrated in FIG. 11, in some other embodiments, the touch control compensation electrode TBC includes a first conductive plate CP1, a second conductive plate CP2, a first conductive bridge connecting the first conductive plate CP1 and the second conductive plate CP2, a third conductive plate CP3, a fourth conductive plate CP4, a fifth conductive plate CP5, and a second conductive bridge CB2 connecting the fourth conductive plate CP4 and the fifth conductive plate CP5. The first conductive plate CP1, the second conductive plate CP2, the third conductive plate CP3, the fourth conductive plate CP4 and the fifth conductive plate CP5 are respectively connected to different parts of the touch control electrode to compensate different parts of the touch control electrode.

For example, as illustrated in FIG. 11, the first conductive bridge CB1 includes a first segment SG1, a second segment SG2, a third segment SG3, a fourth segment SG4 and a fifth segment SG5. The first segment SG1 is provided between the second segment SG2 and the third segment SG3, for example, the second segment SG2 is directly connected to the first segment SG1, and the third segment SG3 is also directly connected to the first segment SG1. The fourth segment SG4 is connected to the first conductive plate CP1 across a part of the second conductive bridge CB2. The fifth segment SG5 is connected between the fourth segment SG4 and the second segment SG2, for example, the second segment SG2 is directly connected to the fifth segment SG5, and the fourth segment SG4 is also directly connected to the fifth segment SG5. For example, two adjacent ones of the first segment SG1, the second segment SG2, the third segment SG3, the fourth segment SG4 and the fifth segment SG5 are respectively provided in different layers, for example, respectively provided in a first touch control metal layer TL1 and a second touch control metal layer TL2 of the touch control layer TL (the first touch control metal layer TL1 and the second touch control metal layer TL2 will be introduced later).

For example, as illustrated in FIG. 11, the touch control compensation electrode TBC further includes a first separator DP1, a second separator DP2 and a third separator DP3. For example, the first separator DP1 is separated from the first conductive bridge CB1 and the third conductive plate CP3, and separates a part of the first conductive bridge CB1 from a part of the third conductive plate CP3. The second separator DP2 is separated from the fifth conductive plate CP5 and the fifth segment SG5, and separates a part of the fifth conductive plate CP5 from a part of the fifth segment SG5. The third separator DP3 separates the third conductive plate CP3 and the fifth conductive plate CP5.

For example, compared with the touch control compensation electrode illustrated in FIG. 11, the touch control compensation electrodes TBC illustrated in FIG. 8-FIG. 10B are respectively provided with a simple structure, and the touch control compensation electrodes TBC in FIG. 8-FIG. 10B will be described in detail below.

Figure 12:
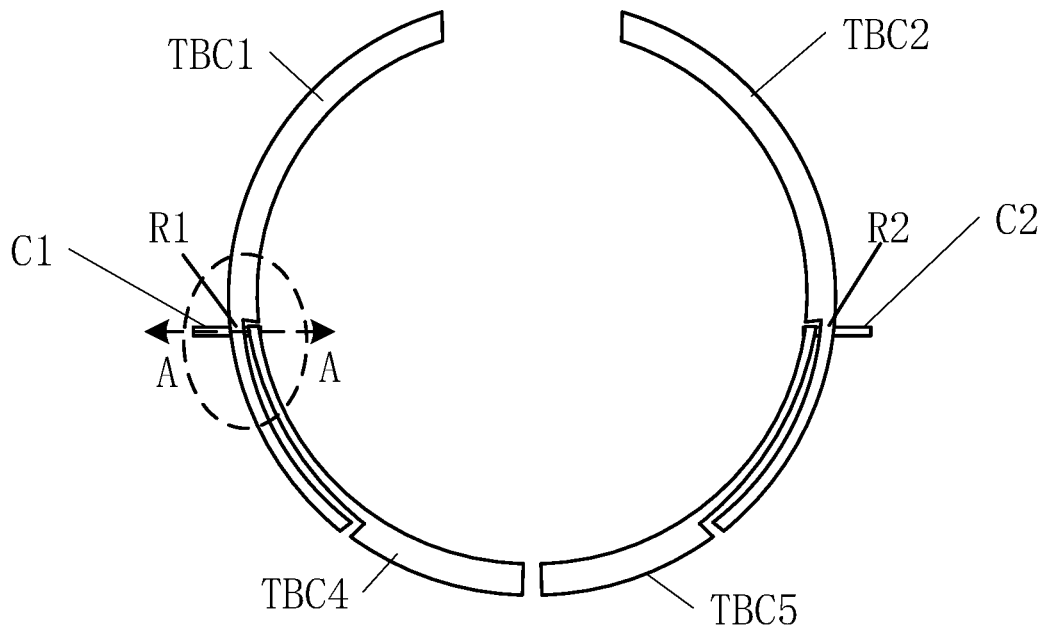
FIG. 12 is a schematic plan view, near an opening, of a touch control compensation electrode in a touch control layer of a display substrate provided by at least one embodiment of the present disclosure.

For example, FIG. 12 illustrates a schematic plan view of the touch control compensation electrode TBC. As illustrated in FIG. 12, in some embodiments, the fourth sub-compensation electrode TBC4 includes a first connection portion C1 for electrical connection, for example, a first connection portion C1 connected to the third sub-touch control electrode RX1 extends below the first sub-compensation electrode TBC1 so as to be connected to the third sub-touch control electrode RX1. The fifth sub-compensation electrode TBC5 includes a second connection portion C2 for electrical connection, for example, a second connection portion C2 connected to the fourth sub-touch control electrode RX2 extends below the second sub-compensation electrode TBC2 so as to be connected to the second sub-compensation electrode TBC2. In this case, in the direction perpendicular to the main surface of the base substrate BS, the first connection portion C1 and the first sub-compensation electrode TBC1 have a first overlapping region R1, and the second connection portion C2 and the second sub-compensation electrode TBC2 have a second overlapping region R2.

Figure 13:
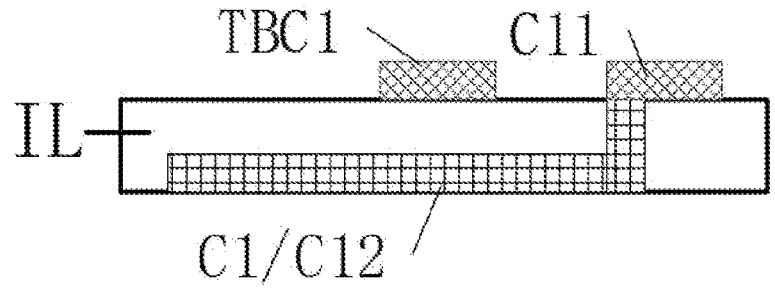
FIG. 13 is a schematic cross-sectional view of the touch control compensation electrode in FIG. 12 along a line A-A.

For example, FIG. 13 illustrates a schematic cross-sectional view of the touch control compensation electrode TBC in FIG. 12 along a line A-A. As illustrated in FIG. 13, the fourth sub-compensation electrode TBC4 includes parts located in different layers, that is, includes a first part C11 and a second part C12, the first part C11 is provided in the same layer and with the same material as the first sub-compensation electrode TBC1, and the second part C12 is formed to be the above-mentioned first connection portion C1, and is overlapped with the first sub-compensation electrode TBC1 in the direction perpendicular to the main surface of the base substrate BS.

For example, as illustrated in FIG. 13, an interlayer insulation layer IL is provided between the first connection portion C1 and the first sub-compensation electrode TBC1, and the material of the interlayer insulation layer IL is at least one of SiN, SiO, SiON, and OC (Optical Clear, optical transparent material). The first part C11 is electrically connected to the second part C12 through a via hole in the interlayer insulation layer IL.

Similarly, the fifth sub-compensation electrode TBC5 (including the second connection portion C2) and the second sub-compensation electrode TBC2 may also have the structure illustrated in FIG. 13, that is, the arrangement manner of the fifth sub-compensation electrode TBC5 or the second sub-compensation electrode TBC2 is basically the same as the arrangement manner of the fourth sub-compensation electrode TBC4 and the first sub-compensation electrode TBC1, which will not be described here.

Similarly, in FIG. 11, the connection structures existing between the conductive plates CP1-CP5 and the segments of the conductive bridges CB1-CB2 may also be basically the same as the arrangement manner of the fourth sub-compensation electrode TBC4 and the first sub-compensation electrode TBC1, which will not be described here.

Figure 14:
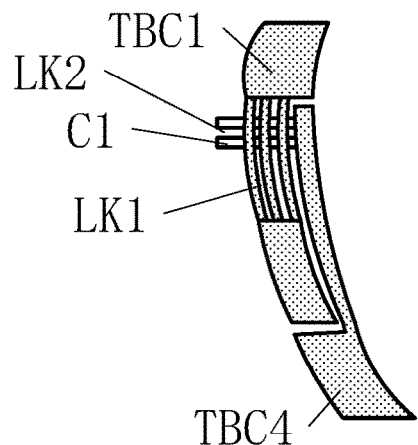
FIG. 14 is another schematic plan view of the touch control compensation electrode in FIG. 12 in a dashed line box.

For example, FIG. 14 illustrates another schematic diagram where the first connection portion overlaps with the first sub-compensation electrode, and the schematic diagram corresponds to a region indicated by the dashed line box in FIG. 12. As illustrated in FIG. 14, in this example, at least one of the first connection portion C1 and the first sub-compensation electrode TBC1 is provided with a hollow portion in the first overlapping region R1.

For example, in the example illustrated in FIG. 14, the first sub-compensation electrode TBC1 is provided with a hollow portion LK1 in the first overlapping region R1, and the first connection portion C1 is provided with a hollow portion LK2 in the first overlapping region R1. In other examples, only the first sub-compensation electrode TBC1 is provided with the hollow portion LK1 in the first overlapping region R1, and the first connection portion C1 isn't provided with a hollow portion; or, only the first connection portion C1 is provided with the hollow portion LK2 in the first overlapping region R, and the first sub-compensation electrode TBC1 isn't provided with a hollow portion.

In the embodiments of the present disclosure, the hollow portion provided in the first connection portion C1 or the first sub-compensation electrode TBC1 can reduce the overlapping area of the first connection portion C1 and the first sub-compensation electrode TBC1 in the direction perpendicular to the main surface of the base substrate, and thus reduce the parasitic capacitance formed between the first connection portion C1 and the first sub-compensation electrode TBC1, thereby reducing or avoiding the adverse effect of the parasitic capacitance on the touch control effect.

For example, in the example illustrated in FIG. 14, the first sub-compensation electrode TBC1 is provided with two hollow portions LK1 in the first overlapping region R1, and the first connection portion C1 is provided with one hollow portion LK2 in the first overlapping region R1. In other examples, the total number of the hollow portion(s) LK1 of the first sub-compensation electrode TBC1 may also be other numbers, such as one, three, four or more; similarly, the total number of hollow portion(s) LK2 of the first connection portion C1 may also be other numbers, such as two, three, four or more. The embodiments of the present disclosure do not limit the total number of the hollow portion(s) LK1 of the first sub-compensation electrode TBC1 and the total number of the hollow portion(s) LK2 of the first connection portion C1.

Similarly, at least one of the second connection portion C2 and the second sub-compensation electrode TBC2 may be provided with a hollow portion in the second overlapping region R2, and the arrangement manner of the hollow portion in the second overlapping region R2 is the same as the hollow portion of the first connection section C1 and the first sub-compensation electrode TBC1 described above, the details can refer to the above-mentioned description of the first connection section C1 and the first sub-compensating electrode TBC1, which will not be repeated here.

Figure 15:
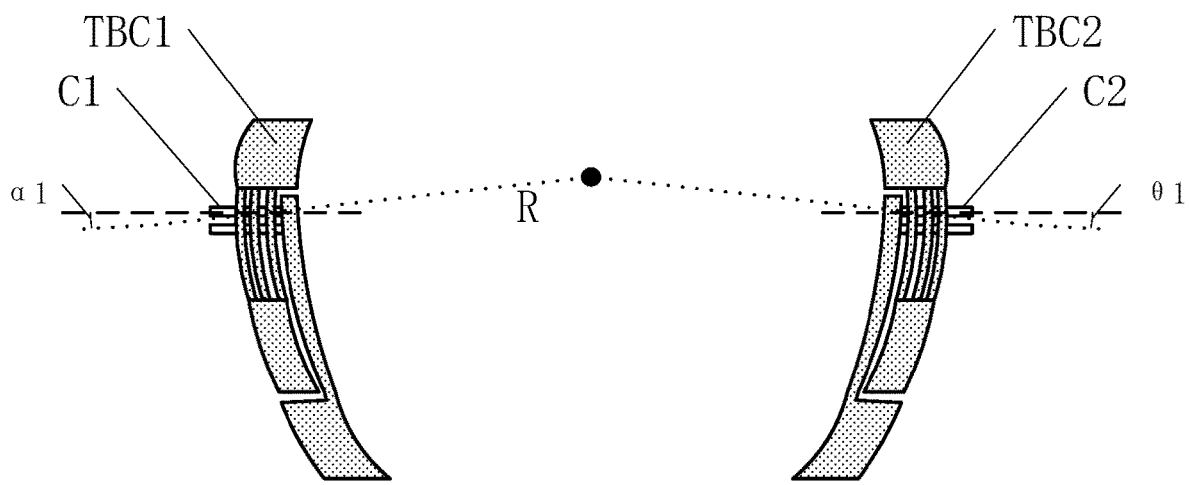
FIG. 15 is a schematic partial plan view, near an opening, of a touch control compensation electrode in a touch control layer of a display substrate provided by at least one embodiment of the present disclosure.

For example, in some embodiments, as illustrated in FIG. 15, the opening O has a center R, and an included angle between a line, which is from any point of an overlapping part of the first connection portion C1 and the first sub-compensation electrode TBC1 to the center R, and the extension direction (the horizontal direction illustrated in FIG. 15) of the first connection portion C1 is $\alpha 1$, then $\alpha 1 < 20°$, for example, $\alpha 1 < 15°$, for example $\alpha 1$ is $15°$, $10°$ or $5°$, etc. The smaller the included angle $\alpha 1$, the smaller the overlapping area between the first connection portion C1 and the first sub-compensation electrode TBC1 in the direction perpendicular to the main surface of the base substrate, and thus the smaller the parasitic capacitance formed by the first connection portion C1 and the first sub-compensation electrode TBC1. For example, in the case where $\alpha 1$ is 0, the overlapping area between the first connection portion C1 and the first sub-compensation electrode TBC1 in the direction perpendicular to the main surface of the base substrate is the smallest, which is more beneficial to improving the touch control effect of the touch control layer.

Similarly, an included angle between a line, which is from any point of an overlapping part of the second connection portion C2 and the second sub-compensation electrode TBC2 to the center R, and the extension direction (the horizontal direction illustrated in FIG. 15) of the second connection portion C2 is $\theta 1$, then $\theta 1 < 20°$, for example, $\theta 1 < 15°$, for example, $\theta 1$ is $15°$, $10°$ or $5°$, etc. The smaller the included angle $\theta 1$, the smaller the overlapping area between the second connection portion C2 and the second sub-compensation electrode TBC2 in the direction perpendicular to the main surface of the base substrate, and thus the smaller the parasitic capacitance formed by the second connection portion C2 and the second sub-compensation electrode TBC2. For example, in the case where $\theta 1$ is 0, the overlapping area between the second connection portion C2 and the second sub-compensation electrode TBC2 in the direction perpendicular to the main surface of the base substrate is the smallest, which is more beneficial to improving the touch control effect of the touch control layer.

For example, in some embodiments, the first sub-compensation electrode TBC1 is provided with the hollow portion LK1, but the first connection portion C1 is not provided with the hollow portion. In this case, the overlapping area of the first connection portion C1 and the first sub-compensation electrode TBC1 is S1, and the area of the hollow portion LK1 of the first sub-compensation electrode TBC1 is S1', then $0.40 < S1/(S1+S1') < 0.71$. Thus, the proportion of the hollow portion LK1 in the first sub-compensation electrode TBC1 is limited, which helps to balance the parasitic capacitance formed between the first sub-compensation electrode TBC1 and the first connection portion C1 and the electrical connection effect and compensation effect of the first sub-compensation electrode TBC1 on the touch control electrode. In addition, the above-mentioned arrangement is further beneficial to achieving a narrow bezel and large-screen design of the display substrate.

For example, in the case where neither the first sub-compensation electrode TBC1 nor the first connection portion C1 is provided with the hollow portion, the parasitic capacitance C1 formed between the first sub-compensation electrode TBC1 and the first connection portion C1 is as below:

$$C1 = \varepsilon 1 * (S1 + S1')/d1 * (\cos\alpha 1).$$

In the above-mentioned equation, d1 is the distance between the first sub-compensation electrode TBC1 and the first connection portion C1, and ci is the dielectric constant of the interlayer insulation layer IL.

For example, in the case where the first sub-compensation electrode TBC1 is provided with the hollow portion LK1 and the first connection portion C1 is not provided with the hollow portion, the parasitic capacitance C2 formed between the first sub-compensation electrode TBC1 and the first connection portion C1 is as below:

$$C2 = \varepsilon 1 * S1/d1 * (\cos\alpha 1).$$

It can be seen that by providing the hollow portion in the first sub-compensation electrode TBC1, the parasitic capacitance between the first sub-compensation electrode TBC1 and the first connection portion C1 can be reduced by $$C3 = C1 - C2 = \varepsilon 1 * S1'/d1 * (\cos\alpha 1).$$

Similarly, in the case where the first connection portion C1 is provided with the hollow portion LK2 and the first sub-compensation electrode TBC1 is not provided with the hollow portion, the parasitic capacitance formed between the first sub-compensation electrode TBC1 and the first connection portion C1 and the reduction amount of the parasitic capacitance can also be calculated accordingly. In the case where the first sub-compensation electrode TBC1 is provided with the hollow portion LK1, and the first connection portion C1 is provided with the hollow portion LK2, the parasitic capacitance formed between the first sub-compensation electrode TBC1 and the first connection portion C1 and the reduction amount of the parasitic capacitance can also be calculated accordingly, which will not be repeated here.

Similarly, in some embodiments, the second sub-compensation electrode TBC2 is provided with a hollow portion, but the second connection portion C2 is not provided with a hollow portion. In this case, the overlapping area of the second connection portion C2 and the second sub-compensation electrode TBC2 is S2, and the area of the hollow portion of the second sub-compensation electrode TBC2 is S2', then $0.40<S2/(S2+S2')<0.71$. Thus, the proportion of the hollow portion LK2 in the second sub-compensation electrode TBC2 is limited, which helps to balance the parasitic capacitance formed between the second connection portion C2 and the second sub-compensation electrode TBC2 and the electrical connection effect and compensation effect of the second sub-compensation electrode TBC2 on the touch control electrode. In addition, the above-mentioned arrangement is also beneficial to achieving a narrow bezel and large-screen design of the display substrate.

For example, in the case where neither the second sub-compensation electrode TBC2 nor the second connection portion C2 is provided with the hollow portion, the parasitic capacitance C4 formed between the second sub-compensation electrode TBC2 and the second connection portion C2 is as below:

$$C4=\varepsilon 1*(S2+S2')/d2*(\cos\theta 1).$$

In the above-mentioned equation, d2 is the distance between the second sub-compensation electrode TBC2 and the second connection portion C2, and ci is the dielectric constant of the interlayer insulation layer IL.

For example, in the case where the second sub-compensation electrode TBC2 is provided with a hollow portion and the second connection portion C2 is not provided with a hollow portion, the parasitic capacitance C5 formed between the second sub-compensation electrode TBC2 and the second connection portion C2 is as below:

$$C5=\varepsilon 1*S2/d2*(\cos\theta 1).$$

It can be seen that by providing the hollow portion in the second sub-compensation electrode TBC2, the parasitic capacitance between the second sub-compensation electrode TBC2 and the second connection portion C2 can be reduced by $$C6=C4-C5=\varepsilon 1*S2'/R2*(\cos\theta 1).$$

Similarly, in the case where the second connection portion C2 is provided with a hollow portion and the second sub-compensation electrode TBC2 is not provided with a hollow portion, the parasitic capacitance formed between the second sub-compensation electrode TBC2 and the second connection portion C2 and the reduction amount of the parasitic capacitance can also be calculated accordingly. Tn the case where the second sub-compensation electrode TBC2 is provided with a hollow portion and the second connection portion C2 is also provided with a hollow portion, the parasitic capacitance formed between the second sub-compensation electrode TBC2 and the second connection portion C2 and the reduction amount of the parasitic capacitance can also be calculated accordingly, which will not be repeated here.

Similarly, the touch control electrodes and the touch control compensation electrodes illustrated in FIG. 10A and FIG. 10B may also be provided with the above-mentioned connection portion and hollow portion, which will not be repeated here.

For example, in some embodiments, as illustrated in FIG. 16, the first signal line L1 includes a first sub-signal line L11 surrounding the opening O, and may further include a second sub-signal line L12 and a third sub-signal line L13 surrounding the opening O.

Figure 17:
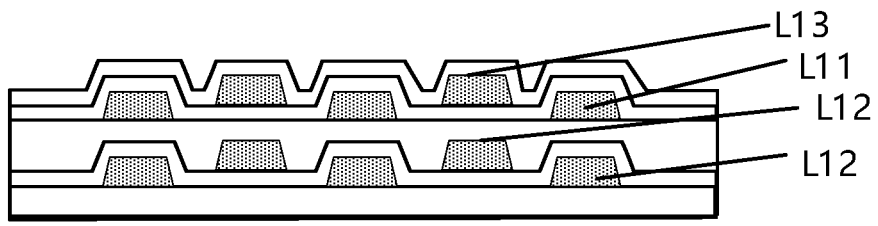
FIG. 17 is a schematic partial cross-sectional view of a first signal line of a display substrate provided by at least one embodiment of the present disclosure.
Figure 18:
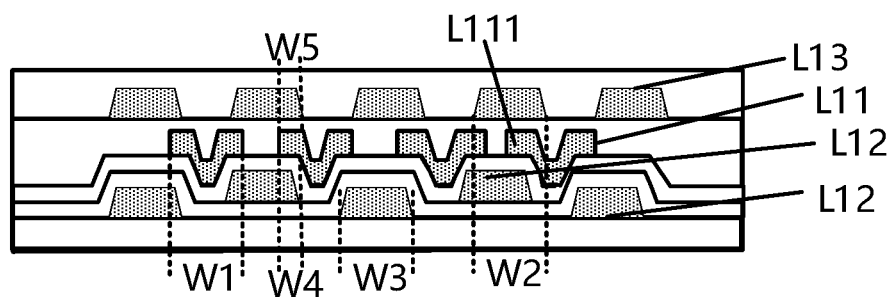
FIG. 18 is another schematic partial cross-sectional view of a first signal line of a display substrate provided by at least one embodiment of the present disclosure.

For example, FIG. 17 and FIG. 18 respectively illustrate schematic cross-sectional views of the first sub-signal line L11, the second sub-signal line L12 and the third sub-signal line L13. For example, in the examples illustrated in FIG. 16 and FIG. 17, longitudinal cross-sections of the first sub-signal line L11, the second sub-signal line L12 and the third sub-signal line L13 are in shape of a rectangle or a trapezoid. In some other examples, as illustrated in FIG. 18, the longitudinal cross-section of the first sub-signal line L11 has at least one bent portion L111, and the longitudinal cross-sections of the second sub-signal line L12 and the third sub-signal line L13 are in shape of a rectangle or a trapezoid.

In the embodiments of the present disclosure, the first sub-signal line L11 with the bent portion L111 can further reduce the space occupied by the first sub-signal line L11, for example, more first sub-signal lines L11 can be provided within the same width range to help achieve the narrow bezel design. Compared with the technical solution of reducing the space occupied by the first sub-signal line L11 only by narrowing the first sub-signal line L11, the above-mentioned technical solution will not increase the resistance of the first sub-signal line L11.

For example, in some embodiments, as illustrated in FIG. 16-FIG. 18, the first sub-signal line L11 is located on a side of the second sub-signal line L12 away from the base substrate BS, and the third sub-signal line L13 is located on a side of the first sub-signal line L11 away from the base substrate BS.

Figure 19:
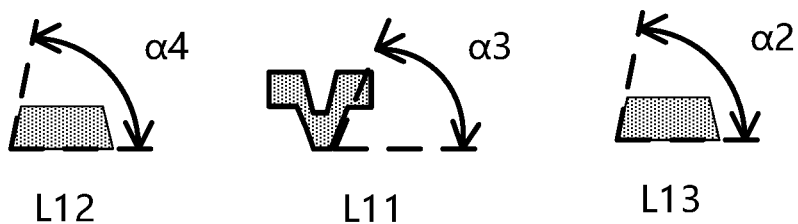
FIG. 19 is a schematic cross-sectional view of respective sub-signal lines of a first signal line of a display substrate provided by at least one embodiment of the present disclosure.

For example, FIG. 19 respectively illustrates schematic cross-sectional views of the first sub-signal line L11, the second sub-signal line L12 and the third sub-signal line L13. As illustrated in FIG. 19, an included angle between a side wall of the third sub-signal line L13 and the main surface of the base substrate BS is α2, an included angle between a side wall of the first sub-signal line L11 and the main surface of the base substrate BS is α3, and an included angle between a side wall of the second sub-signal line L12 and the main surface of the base substrate BS is α4, then $$\alpha 3 \leq \alpha 4 \text{ and } \alpha 3 < \alpha 2.$$

For example, in some examples, α2<75°, α3>30°, 40°<α4<50°, for example, α2=70°, α3=35°, and α4=45°. In this case, the angle of α3 is smaller, thereby avoiding the risk of break of the first sub-signal line L11, for example avoiding the risk of break of the first sub-signal line L11 at the position of the bent portion L111 to ensure process stability. Furthermore, the above-mentioned angle design further facilitates the encapsulation effect above the wire, avoiding the peeling phenomenon between the wire and its adjacent insulation layer; in addition, the above-mentioned angle design of the wire is further beneficial to increasing the encapsulation path and preventing external impurities such as water and oxygen from entering the opening O to the interior of the display substrate through the gap between the wire and the insulation layer adjacent to the wire, thereby helping to protect the structure of the display substrate.

For example, in some embodiments, the width of the orthographic projection of the first sub-signal line L11 on the base substrate BS is smaller than the width of the orthographic projection of the third sub-signal line L13 on the base substrate BS. For example, in some embodiments, the area of the orthographic projection of the first sub-signal line L11 on the base substrate BS is smaller than the area of the orthographic projection of the third sub-signal line L13 on the base substrate BS. For example, in some embodiments, the extension length of the orthographic projection of the first sub-signal line L11 on the base substrate BS is substantially equal to the extension length of the orthographic projection of the third sub-signal line L13 on the base substrate BS.

In the embodiments of the present disclosure, because the first sub-signal line L11 has the bent portion L111, and the third sub-signal line L13 doesn't have a bent portion, the above-mentioned setting facilitates the resistance consistency of the first sub-signal line L11 and the third sub-signal line L13, thereby enabling the effect of transmitting electrical signals, such as the transmission speed, of the first sub-signal line L11 and the third sub-signal line L13 substantially consistent, which is beneficial to optimizing the display effect of the display substrate.

For example, in some embodiments, the width of the orthographic projection of the first sub-signal line L11 on the base substrate BS is W1, then W1 ranges from 1.3 μm to 1.7 μm, such as 1.4 μm, 1.45 μm, 1.5 μm, 1.55 μm, 1.6 μm, 1.65 μm, etc.; for example, the width of the orthographic projection of the third sub-signal line L13 on the base substrate BS is W2, then W2 ranges from 1.7 μm to 2.3 μm, such as 1.8 μm, 1.9 μm, 2.0 μm, 2.1 μm, 2.2 μm, etc.; and for example, the width of the orthographic projection of the second sub-signal line L12 on the base substrate BS is W3, then W3 ranges from 1.7 μm to 2.3 μm, such as 1.8 μm, 1.9 μm, 2.0 μm, 2.1 μm, 2.2 μm, etc.

Figure 20:
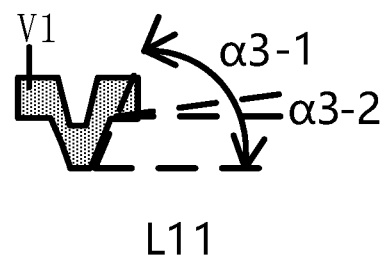
FIG. 20 is a schematic cross-sectional view of a first sub-signal line of a first signal line of a display substrate provided by at least one embodiment of the present disclosure.
Figure 21:
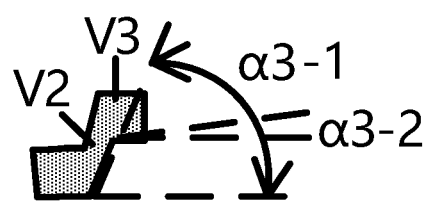
FIG. 21 is another schematic cross-sectional view of a first sub-signal line of a first signal line of a display substrate provided by at least one embodiment of the present disclosure.

For example, in some embodiments, as illustrated in FIG. 20, the longitudinal cross-section of the first sub-signal line L11 is in shape of a V-shape as a whole, and in this case, $W1=W2*\cos\alpha3$. Alternatively, in some other embodiments, as illustrated in FIG. 21, the longitudinal cross-section of the first sub-signal line L11 is in shape of a half-V-shape as a whole, and in this case, $W1>W2*\cos\alpha3$.

For example, in some embodiments, as illustrated in FIG. 18, a first overlapping part is between the orthographic projection of the first sub-signal line L11 on the base substrate BS and the orthographic projection of the second sub-signal line L12 on the base substrate BS, and the width of the first overlapping part ranges from 0 μm to 0.1 μm, such as 0.01 μm, 0.03 μm, 0.05 μm, 0.07 μm, 0.09 μm, etc.

For example, in some embodiments, as illustrated in FIG. 18, a second overlapping part is between the orthographic projection of the third sub-signal line L13 on the base substrate BS and the orthographic projection of the second sub-signal line L12 on the base substrate BS are provided with, and the width of the second overlapping part ranges from 0.18 μm to 0.30 μm, such as 0.20 μm, 0.22 μm, 0.25 μm, 0.27 μm, etc.

For example, among the above-mentioned various width data, the range of each width may not include the endpoint value, for example, the width W5 of the second overlapping part is 0.18 μm~0.3 μm, that is, W5 is greater than 0.18 μm and less than 0.3 μm, and for another example, the width W4 of the first overlapping part is 0 μm~0.11 μm, that is, W4 is greater than 0 μm and less than 0.1 μm. The case of widths W1, W2 and W3 is similar to the above.

In the embodiments of the present disclosure, by allowing the signal lines in different layers to have overlapping parts in the direction perpendicular to the main surface of the base substrate, the space occupied by the first signal line L1 on the display substrate as a whole can be reduced, which facilitates the large-screen design of the display substrate.

For example, in some embodiments, the width of the first overlapping part and the width of the second overlapping part are approximately the same, thereby facilitating a narrow bezel around the opening O and consistency of the process. In some other embodiments, the width of the first overlapping part is smaller than the width of the second overlapping part. Because the distance between the first sub-signal line L11 and the second sub-signal line L12 is relatively short, a short circuit between the first sub-signal line L11 and the second sub-signal line L12 can be avoided by reducing the overlap between the first sub-signal line L11 and the second sub-signal line L12.

For example, in some embodiments, as illustrated in FIG. 20, the longitudinal cross-section of the first sub-signal line L11 includes a V-shaped portion and an extension portion V1 located on at least one end of the V-shaped portion (two ends illustrated in the figure), an included angle between a sidewall of the V-shaped portion and the main surface of the base substrate BS is α3-1, and an included angle between a side of the extension portion V1 close to the base substrate BS and the main surface of the base substrate BS is α3-2, then $$\alpha3\text{-}1>\alpha3\text{-}2.$$

For example, α3-1<46°, α3-2>10°, for example, in some examples, α3-1 is 30°, 35°, 40° or 45°, and α3-2 is 12°, 15° or 20°.

For example, in some embodiments, α3-1≥α3-2, where α3-1<30° and α3-2>15°. In some examples, α3-1 is 20°, 23°, 26° or 28°, and α3-2 is 16°, 18° or 20°.

For example, in some other embodiments, as illustrated in FIG. 21, the longitudinal cross-section of the first sub-signal line L11 includes an inclined portion V2 and an extension portion V3 located on one end of the inclined portion V2, an included angle between a sidewall of the inclined portion V2 and the main surface of the base substrate BS is α3-1, and an included angle between a side of the extension portion V3 close to the base substrate BS and the main surface of the base substrate BS is α3-2, then $$\alpha3\text{-}1>\alpha3\text{-}2.$$

In the above-mentioned case, $W1=W2\text{-}1*\cos\alpha3\text{-}1+W2\text{-}2*\cos\alpha3\text{-}2$.

For example, α3-2 is greater than zero. The above-mentioned setting can increase the contact area of the first sub-signal line L11 and an insulation layer adjacent to the first sub-signal line L11, enhance the bonding effect of the first sub-signal line L11 and the insulation layer adjacent to the first sub-signal line L11, and prevent the occurrence of defects such as wire falling off.

For example, in some embodiments, α3-1<30°, 0°<α3-2<10°. For example, α3-1 is 20°, 23°, 26° or 28°, and α3-2 is 2°, 5°, 7°, 9°, etc.

For example, referring to FIG. 4 and FIG. 5, in some embodiments, the first signal line L1 is provided in the same layer and with the same material as some functional layers in the display region AA. For example, the first sub-signal line L11 is provided in the same layer and with the same material as the source electrode SE and the drain electrode DE. For example, the second sub-signal line L12 is provided in the same layer and with the same material as the gate electrode GT and the first capacitor electrode CE1, or the second sub-signal line L12 is provided in the same layer and with the same material as the second capacitor electrode CE2; or, a part of the second sub-signal line L12 is provided in the same layer and with the same material as the gate electrode GT and the first capacitor electrode CE1, and another part of the second sub-signal line L12 is provided in the same layer and with the same material as the second capacitor electrode CE2.

For example, referring to FIG. 5, in some embodiments, the pixel driving circuit further includes a connection electrode E4 provided on a side of the source electrode SE and the drain electrode DE away from the base substrate BS. In this case, the third sub-signal line L13 is provided in the same layer and with the same material as the connection electrode E4.

For example, in some embodiments, the first signal line L1 is configured to be electrically connected to the pixel driving circuits of a plurality of sub-pixels in the display region, and is configured to provide electrical signals such as data signals or scan signals to the pixel driving circuits. For example, in some examples, at least some of the first sub-signal line L11, the second sub-signal line L12, and the third sub-signal line L13 are implemented as scan lines SL, and at least some are implemented as data lines DL.

Figure 22:
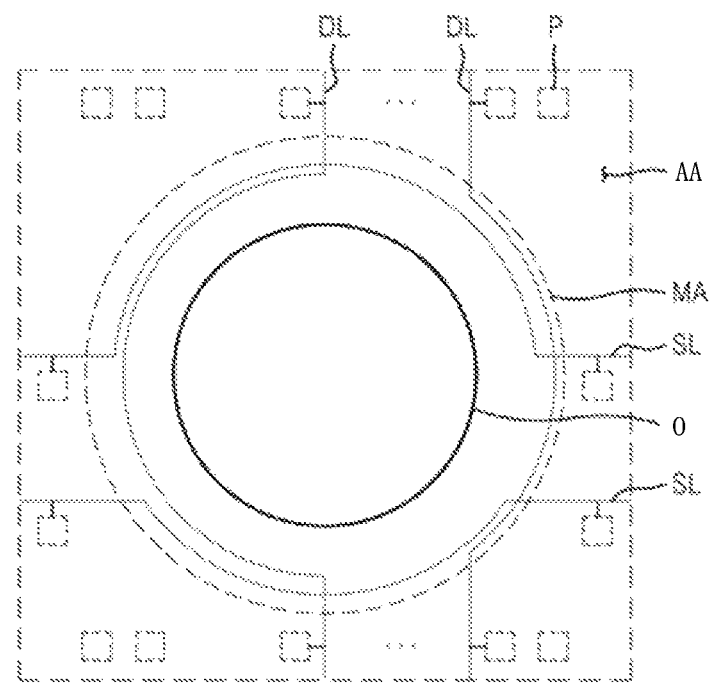
FIG. 22 is a schematic plan view, surrounding an opening, of a first signal line of a display substrate provided by at least one embodiment of the present disclosure.

For example, FIG. 22 illustrates a schematic diagram, surrounding the opening O, of the first signal line L1 in the case where the first signal line L1 serves as the scan line SL and the data line DL. For example, as illustrated in FIG. 22, the scan line SL and the data line DL are arranged around the opening O in a region MA of the display region AA close to the opening O, and the scan line SL and the data line DL are respectively connected to pixel driving circuits of a plurality of sub-pixels P to provide scan signals or data signals.

Figure 23:
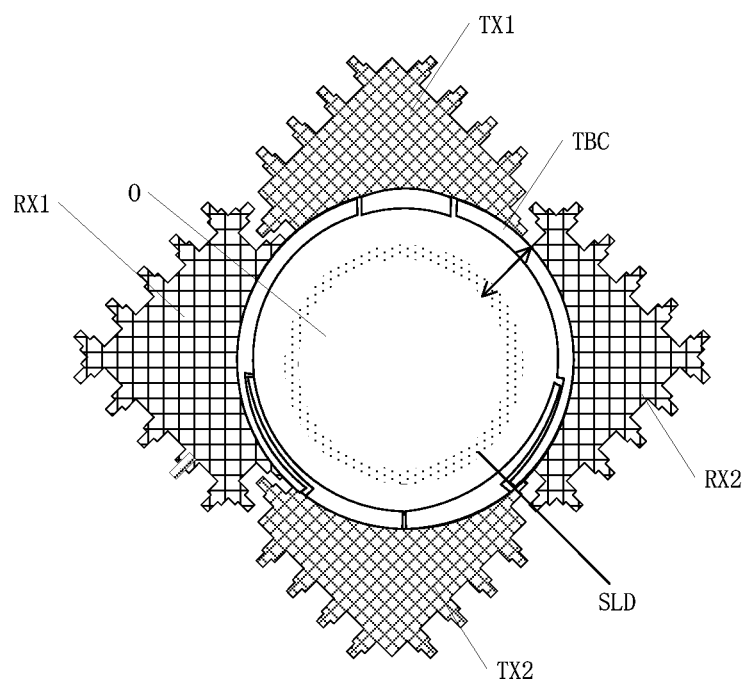
FIG. 23 is another schematic partial plan view, near an opening, of a touch control layer of a display substrate provided by at least one embodiment of the present disclosure.

For example, in some embodiments, as illustrated in FIG. 23, the display substrate further includes a light-shielding ring SLD surrounding the opening O, and the light-shielding ring SLD is provided in the same layer and with the same material as the touch control layer TL. The light-shielding ring SLD can provide light-shielding effect for some signal lines on the display substrate.

For example, in some embodiments, as illustrated in FIG. 23, in a direction parallel to the main surface of the base substrate BS, the light-shielding ring SLD is located on a side of the touch control compensation electrode TBC close to the opening O, and the first signal line L1 is provided within a range defined by the touch control compensation electrode TBC and the light-shielding ring SLD, that is, the range indicated by the arrow in the figure.

For example, in some embodiments, in the direction perpendicular to the main surface of the base substrate BS, the first signal line L1 (for example, one or more of the first sub-signal line L11, the second sub-signal line L12 and the third sub-signal line L13) at least partially overlaps with the light-shielding ring SLD. Therefore, the light-shielding ring SLD can achieve the light-shielding effect for these signal lines.

Figure 24:
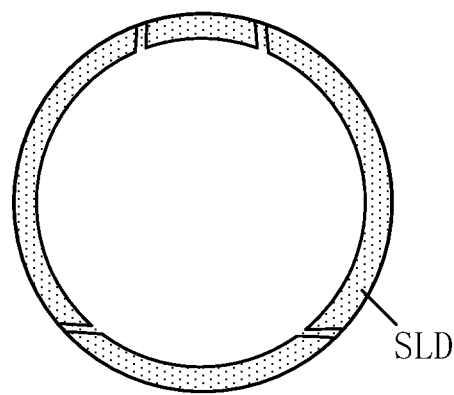
FIG. 24 is a schematic plan view of a light-shielding ring of a display substrate provided by at least one embodiment of the present disclosure.

For example, FIG. 24 illustrates another schematic plan view of the light-shielding ring. As illustrated in FIG. 24, in some embodiments, the light-shielding ring SLD includes a plurality of light-shielding portions spaced apart from each other. The plurality of light-shielding portions are disconnected from each other, thus the light-shielding ring SLD can avoid electrostatic accumulation and prevent the touch control effect of the touch control layer from being affected.

For example, in the case where the touch control layer includes a plurality of metal layers, such as a first touch control metal layer and a second touch control metal layer described later, different portions of the light-shielding ring SLD may be provided in the same layer and with the same material as different touch control metal layers, or only provided in the same layer and with the same material as one of the first touch control metal layer and the second touch control metal layer.

For example, in some embodiments, the light-shielding ring SLD may further include a plurality of sub-light-shielding rings surrounding the opening O, and the plurality of sub-light-shielding rings are sequentially arranged in a direction away from the opening O. In this case, the sub-light-shielding ring farthest from the opening O is provided in the same layer and with the same material as the first touch control metal layer to help improve the light-shielding effect.

Figure 25:
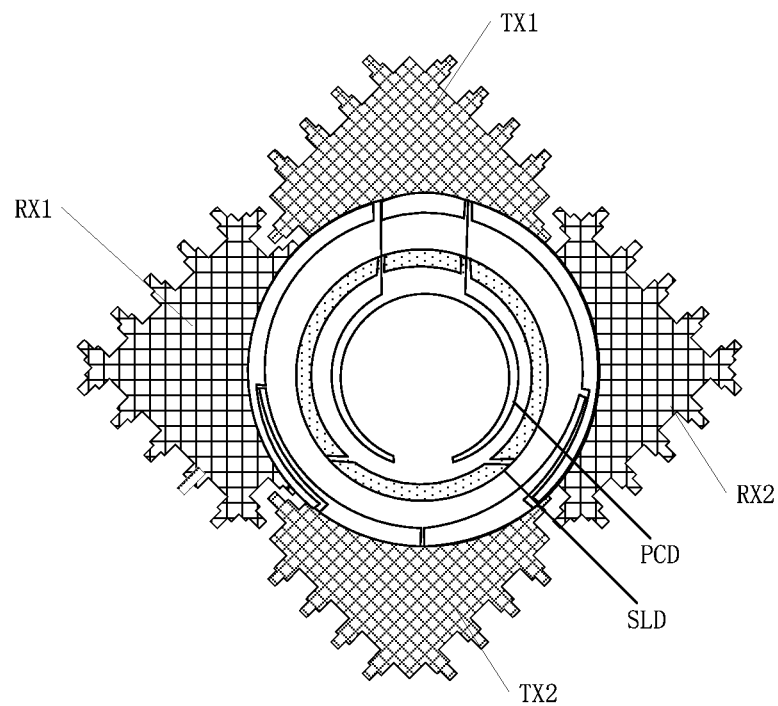
FIG. 25 is another schematic partial plan view, near an opening, of a touch control layer of a display substrate provided by at least one embodiment of the present disclosure.

For example, FIG. 25 illustrates another schematic plan view of the display substrate near the opening O. As illustrated in FIG. 11 and FIG. 25, in some embodiments, the display substrate further includes a detection wire PCD surrounding the opening O, and the detection wire PCD is electrically connected to the touch control electrode. For example, the detection wire PCD can be used as a crack detection circuit for detecting whether there is a crack near the opening O, for example, the detection wire PCD can also detect whether the touch control electrodes are connected normally.

For example, in some embodiments, the detection wire PCD is provided in the same layer and with the same material as the touch control layer TL. For example, at least portion of the detection wire PCD (e.g., a portion extending around the opening O) is located on a side of the light-shielding ring SLD close to the opening O.

Figure 26:
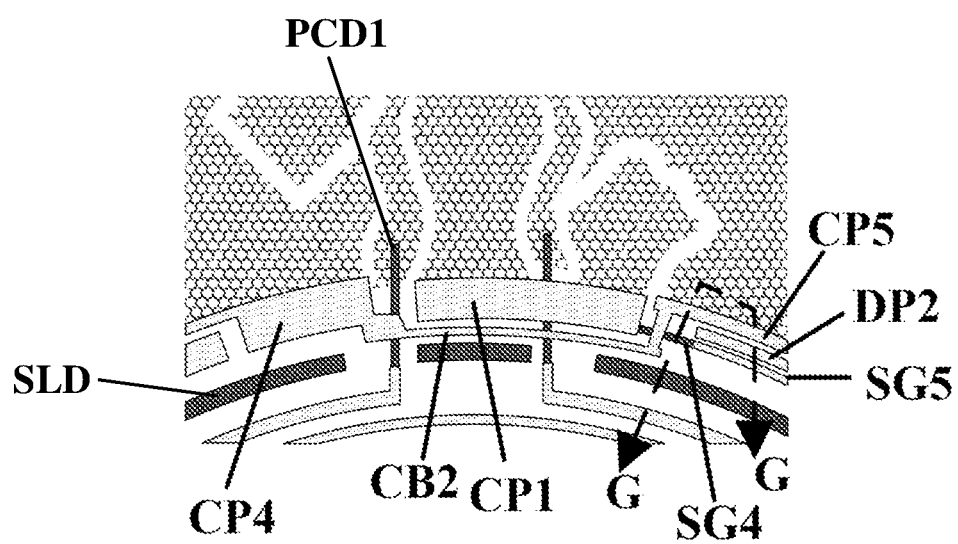
FIG. 26 is a connection schematic diagram of a detection wire of a display substrate provided by at least one embodiment of the present disclosure.

For example, FIG. 26 illustrates a schematic plan view of the touch control layer in FIG. 11 in the dashed line box ZR. As illustrated in FIG. 26, an end portion PCD1 of the detection wire PCD extends from below the touch control compensation electrode TBC to the touch control electrode, in order to be electrically connected to the touch control electrode. For example, the end portion PCD1 of the detection wire PCD is located in the first touch control metal layer of the touch control layer, and the first conductive plate CP1 of the touch control compensation electrode TBC is located in the second touch control metal layer of the touch control layer, so that the end portion PCD1 of the detection wire PCD can pass under the first conductive plate CP1.

Figure 27:
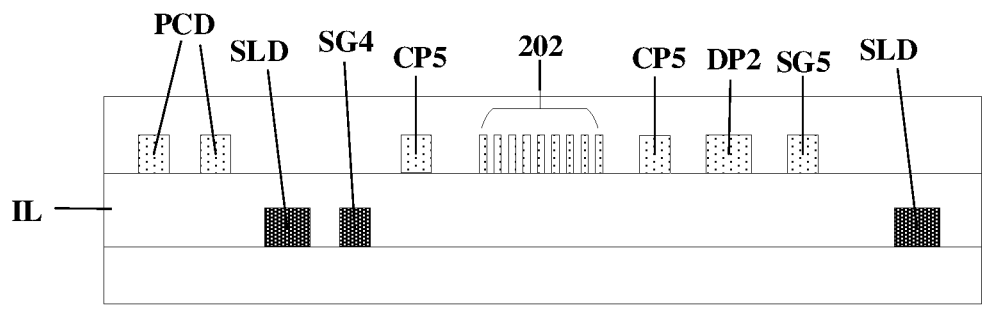
FIG. 27 is a schematic cross-sectional view of the display substrate in FIG. 26 along a line G-G.

For example, FIG. 27 illustrates a schematic cross-sectional view of the touch control layer in FIG. 26 along a line G-G. As illustrated in FIG. 27, in some examples, in combination with FIG. 21 and FIG. 26, a portion of the detection wire PCD surrounding the opening O (that is, the light-colored portion in FIG. 26) is provided in the second touch control metal layer, a portion of the detection wire PCD extending to the touch control electrode (i.e., the dark portion in FIG. 26) is provided in the first touch control metal layer, and the light-shielding ring SLD is provided in the first touch control metal layer. Therefore, the structures located in the same layer can be formed simultaneously using the same material and the same patterning process to simplify the manufacturing process of the touch control layer.

Figure 28:
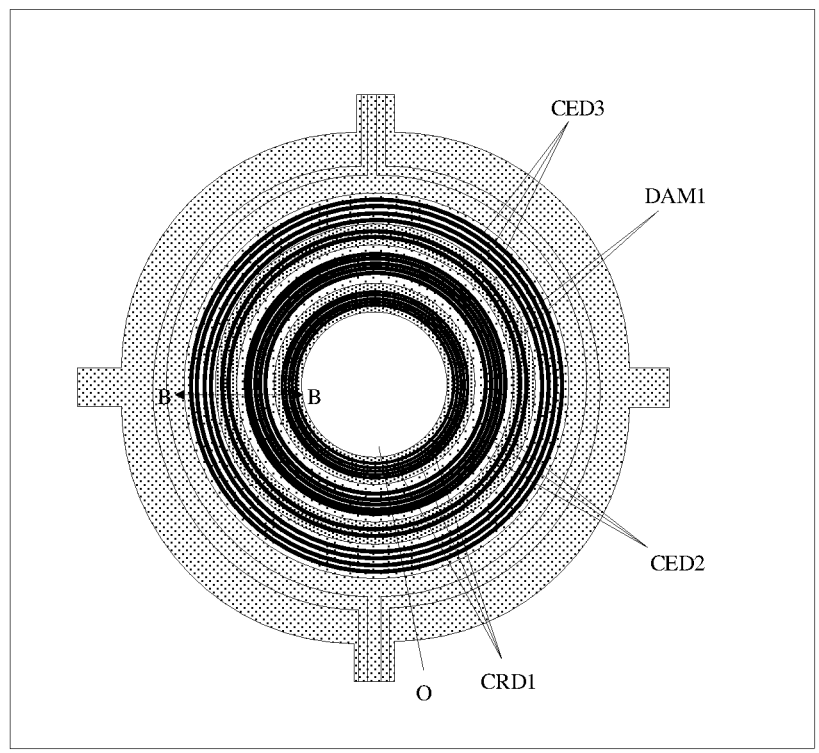
FIG. 28 is a schematic plan view, surrounding an opening, of a barrier dam of a display substrate provided by at least one embodiment of the present disclosure.

For example, FIG. 28 illustrates another schematic plan view of the display substrate near the opening. As illustrated in FIG. 28, the display substrate further includes a barrier dam surrounding the opening O, and the barrier dam is located on a side of the first signal line L1 close to the opening O. In the embodiments of the present disclosure, the barrier dam can prevent impurities such as water and oxygen from entering the interior of the display substrate through the opening O to protect the display substrate. In addition, when the opening O is formed in the display region AA by mechanical stamping or cutting, the barrier dam can also prevent the generation of cracks, or prevent the crack from extending from the opening O to the interior of the display substrate, thereby achieving the protection effect against cracks.

Figure 29:
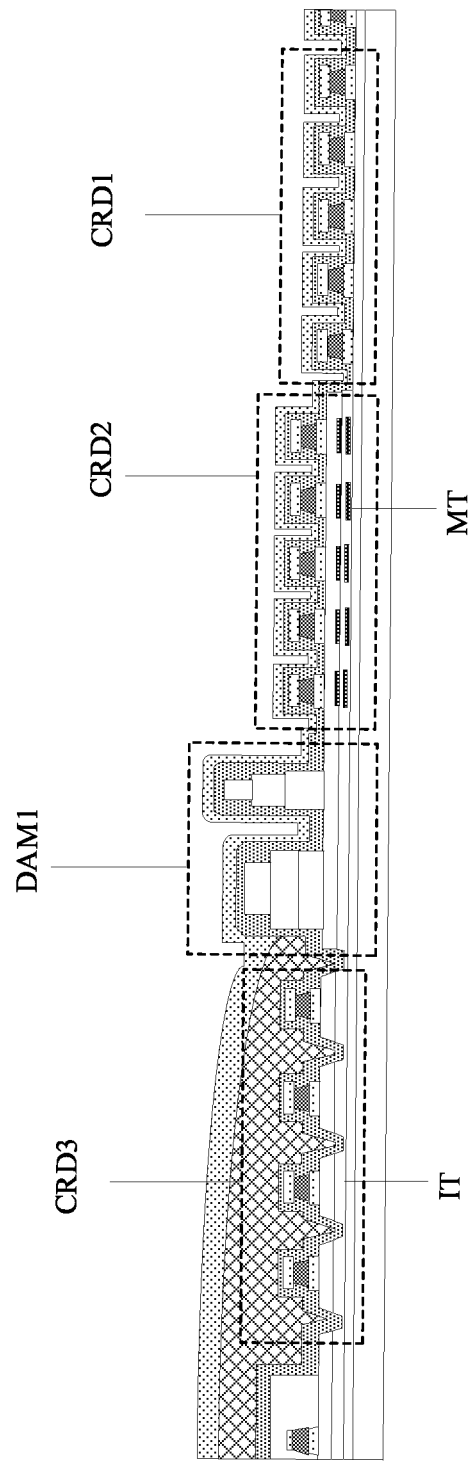
FIG. 29 is a schematic cross-sectional view of the display substrate in FIG. 28 along a line B-B.

For example, FIG. 29 illustrates a schematic cross-sectional view of the display substrate in FIG. 28 along a line B-B. As illustrated in FIG. 29, the display substrate includes a plurality of barrier dam surrounding the opening O, for example, includes a first barrier dam CRD1, a second barrier dam CRD2, and a third barrier dam CRD3 arranged in sequence along the direction away from the opening O. For example, each of the first barrier dam CRD1, the second barrier dam CRD2 and the third barrier dam CRD3 includes a plurality of sub-barrier dams. The plurality of barrier dam design can enhance the blocking effect on external impurities such as water and oxygen, and enhance the protection effect against cracks on the display substrate.

For example, in some embodiments, the display substrate further includes a barrier wall DAM1 surrounding the opening O, and the barrier wall DAM1 is provided between two adjacent ones of the first barrier dam CRD1, the second barrier dam CRD2 and the third barrier dam CRD3, illustrated in the figure as being between the second barrier dam CRD2 and the third barrier dam CRD3.

For example, the barrier wall DAM1 typically has a higher height, for example, than at least some of the first barrier dam CRD1, the second barrier dam CRD2 and the third barrier dam CRD3. The barrier wall DAM1 can increase the path for external impurities such as water and oxygen to enter the interior of the display substrate, thereby further enhancing the blocking effect on external impurities such as water and oxygen.

For example, in some embodiments, at least part of the barrier dam is provided in the same layer and with the same material as the source electrode SE and the drain electrode DE. For example, in some embodiments, the source electrode SE and the drain electrode DE are formed of metal materials such as copper, aluminum, titanium, or molybdenum, or alloy materials thereof, for example, formed to be a multilayer metal stacked structure, for example, a three-layer metal stacked structure such as titanium/aluminum/titanium, molybdenum/aluminum/molybdenum, etc. In this case, at least part of the barrier dam is provided in the same layer and with the same material as the source electrode SE and the drain electrode DE, so that at least part of the barrier dam is further provided with a three-layer metal stacked structure such as titanium/aluminum/titanium, molybdenum/aluminum/molybdenum, etc.

For example, in the example illustrated in FIG. 29, the first barrier dam CRD1 is provided with a three-layer metal stacked structure such as titanium/aluminum/titanium, molybdenum/aluminum/molybdenum, etc. The second barrier dam CRD2 is provided with a three-layer metal stacked structure such as titanium/aluminum/titanium, molybdenum/aluminum/molybdenum, etc. in the same layer and with the same material as the source electrode SE and the drain electrode DE, and is further provided with a partial metal layer MT, below the three-layer metal stacked structure, in the same layer and with the same material as the gate electrode AT and the second capacitor electrode CE2. The third barrier dam CRD3 is provided with a three-layer metal stacked structure such as titanium/aluminum/titanium, molybdenum/aluminum/molybdenum, etc. in the same layer and with the same material as the source electrode SE and the drain electrode DE, and is further provided with an insulation layer IT, below the three-layer metal stacked structure, in the same layer and with the same material as an insulation layer such as the first gate insulation layer, the second gate insulation layer, the interlayer insulation layer, etc. Therefore, the first barrier dam CRD1, the second barrier dam CRD2 and the third barrier dam CRD3 may be provided with different heights to enhance the barrier effect of the barrier dam.

For example, in some embodiments, the barrier wall DAM1 is provided in the same layer and with the same material as the planarization layer, the pixel defining layer and the spacer. That is, the barrier wall DAM1 includes a plurality of sub-barrier layers, and these sub-barrier layers are respectively provided in the same layer and with the same material as the planarization layer, the pixel defining layer and the spacer.

For example, in some other embodiments, the above-mentioned barrier effect can also be achieved by providing other structures near the opening O. For example, referring to FIG. 4 and FIG. 5, the pixel driving circuit includes a plurality of insulation sub-layers, and the plurality of insulation sub-layers are respectively provided between the active layer AT and the gate electrode GT (that is, the first gate insulation layer 102), between the gate electrode GT and the second capacitor electrode CE2 (that is, the second gate insulation layer 103), and between the second capacitor electrode and the source electrode and drain electrode (that is, the interlayer insulation layer 104), etc. As illustrated in FIG. 16, the display substrate further includes a groove GR surrounding the opening O, and the groove GR is located on a side of the first signal line L1 close to the opening O, and is at least provided in one of the plurality of insulation sub-layers (for example, the first gate insulation layer 102, the second gate insulation layer 103 and the interlayer insulation layer 104) or provided in the base substrate BS. For example, in some examples, the groove GR may also be provided in the buffer layer 101 and the base substrate BS, as illustrated in FIG. 16. For example, in this example, the buffer layer 101 includes a plurality of buffer sub-layers 1011/1012 to facilitate the formation of the groove GR.

In the embodiments of the present disclosure, the groove GR can prevent impurities such as water and oxygen from entering the interior of the display substrate through the opening O to protect the display substrate. In addition, when the opening O is formed in the display region AA by mechanical stamping or cutting, the groove GR can also prevent the generation of cracks, or prevent the crack from extending from the opening O to the interior of the display substrate, thereby achieving the protection effect against cracks.

For example, in some other embodiments, the display substrate can further be provided with the above-mentioned barrier dam, barrier wall and groove to effectively achieve the protection effect of the display substrate.

For example, as illustrated in FIG. 16, the display substrate includes the groove GR and further includes the barrier wall DAM and, the barrier wall DAM includes three sub-layers M1/M2/M3, and for example, the three sub-layers M1/M2/M3 are respectively provided in the same layer and with the same material as the planarization layer, the pixel defining layer and the spacer.

For example, in some embodiments, the touch control layer TL includes a first touch control metal layer TL1, an interlayer insulation layer IL and a second touch control metal layer TL2 which are sequentially stacked in a direction away from the base substrate BS. For example, FIG. 30 illustrates a schematic plan view of the first touch control metal layer TL1, FIG. 31 illustrates a schematic plan view of the second touch control metal layer TL2, and FIG. 32 illustrates a schematic plan view of the touch control layer TL formed by stacking the first touch control metal layer TL1 and the second touch control metal layer TL2.

Figure 30:
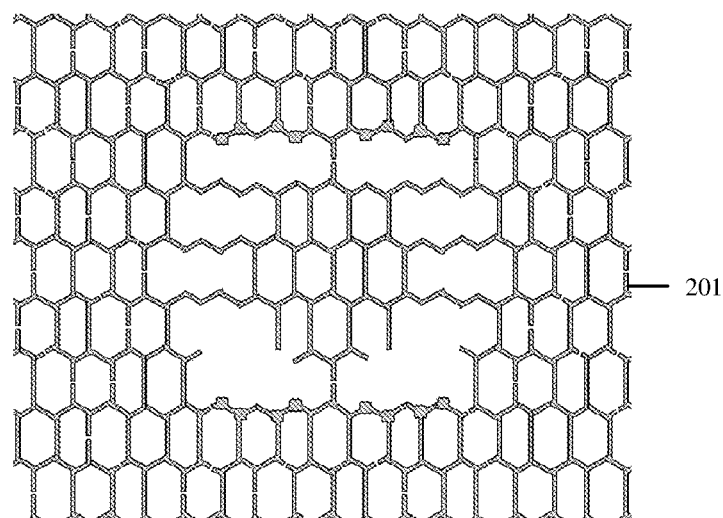
FIG. 30 is a schematic plan view of a first touch control metal layer of a touch control layer of a display substrate provided by at least one embodiment of the present disclosure.

For example, as illustrated in FIG. 30, in some embodiments, the first touch control metal layer TL1 includes a first grid touch control electrode formed by a plurality of metal lines. As illustrated in FIG. 31, the second touch control metal layer TL2 includes a second grid touch control electrode formed by a plurality of metal lines. The first grid touch control electrode and the second grid touch control electrode are, for example, electrically connected with each other at some positions, which can form rectangular block electrodes connected along the first direction and the second direction as illustrated in FIG. 6, FIG. 7 and FIG. 8.

Figure 31:
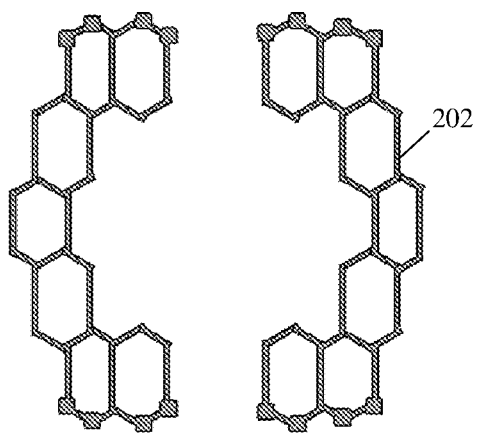
FIG. 31 is a schematic plan view of a second touch control metal layer of a touch control layer of a display substrate provided by at least one embodiment of the present disclosure.
Figure 32:
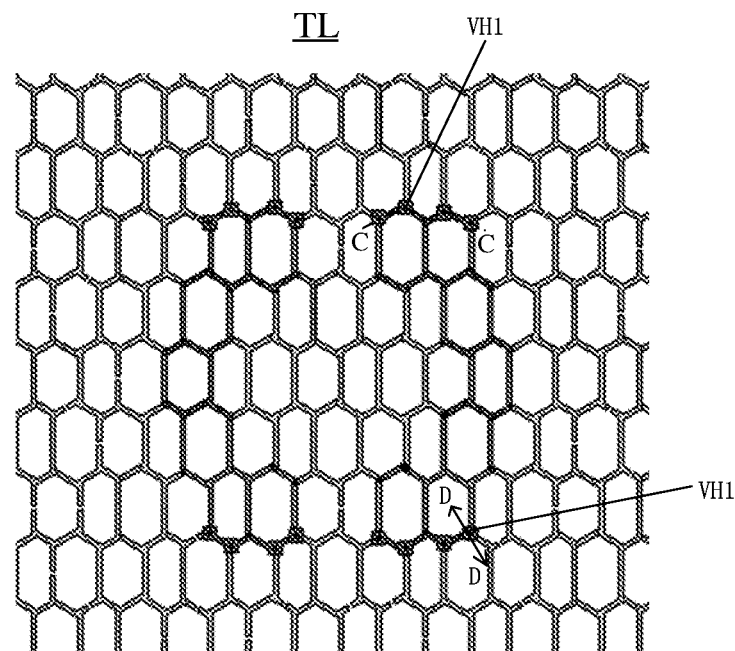
FIG. 32 is a schematic plan view obtained by stacking a first touch control metal layer with a second touch control metal layer of a touch control layer of a display substrate provided by at least one embodiment of the present disclosure.

For example, as illustrated in FIG. 30 to FIG. 32, at least part of the touch control electrodes include a first metal line 201 located in the first touch control metal layer TL1 and a second metal line 202 located in the second touch control metal layer TL2, a first via hole VH1 is provided in the interlayer insulation layer IL, and the first metal line 201 is electrically connected to the second metal line 202 through the first via hole VH1, so that the second grid touch control electrode formed by the plurality of metal lines in the second touch control metal layer TL2 electrically connects the first grid touch control electrode formed by the plurality of metal lines in the first touch control metal layer TL1 at the disconnected part.

Figure 33:
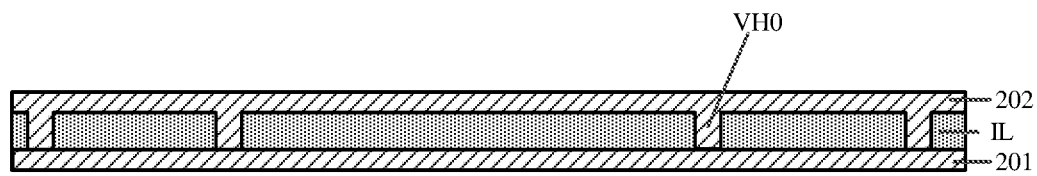
FIG. 33 is a schematic cross-sectional view of the touch control layer in FIG. 32 along a line C-C.

For example, FIG. 33 is a schematic cross-sectional view of the touch control layer in FIG. 32 along a line C-C. As illustrated in FIG. 33, in this cross-section, the interlayer insulation layer IL is provided with four first via holes VH1, and the second metal line 202 in the second touch control metal layer TL2 is electrically connected to the first metal line 201 in the first touch control metal layer TL1 through the four first via holes VH1.

In the embodiments of the present disclosure, providing the plurality of first via holes VH1 can improve the electrical connection effect between the first metal line 201 and the second metal line 202.

Figure 34:
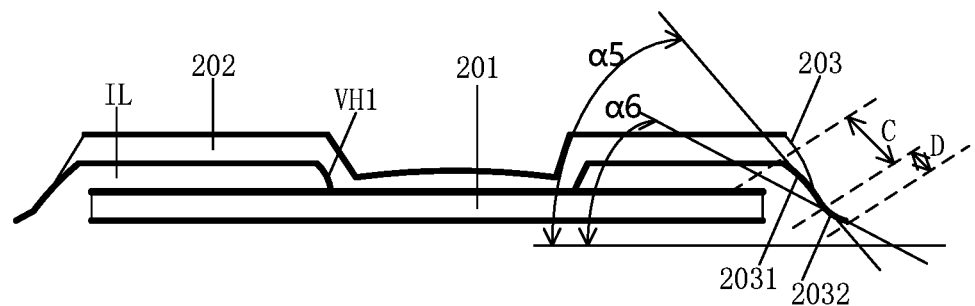
FIG. 34 is a schematic cross-sectional view of the touch control layer in FIG. 32 along a line D-D.

For example, FIG. 34 is a schematic cross-sectional view of the touch control layer in FIG. 32 along a line D-D, that is, a schematic cross-sectional view, at a first via hole VH1, along the direction perpendicular to the extension direction of the first metal line 201 or the second metal line 202.

As illustrated in FIG. 34, the second metal line 202 is provided with a first slope portion 203 on a side edge of the first metal line 201, the first slope portion 203 includes a first sub-slope portion 2031 and a second sub-slope portion 2032, and the first sub-slope portion 2031 is located on a side of the second sub-slope portion 2032 away from the base substrate BS. The maximum angle formed between a tangent of any point of the first sub-slope portion 2031 and the main surface of the base substrate BS is $\alpha 5$, and the maximum angle formed between a tangent of any point of the second sub-slope portion 2032 and the main surface of the base substrate BS is $\alpha 6$, then $\alpha 5 > \alpha 6$. Thus, the second metal line 202 can better cover the first metal line 201 and the interlayer insulation layer IL, so in the process of forming the second metal line 202, chlorine (Cl2) in the gas used in the etching process is not in contact with the interlayer insulation layer IL at least in the portion of the first sub-slope portion 2031 and the second sub-slope portion 2032 that covers the interlayer insulation layer IL, thus avoiding the following problem that may exist in the related technology: because chlorine is in contact with the interlayer insulation layer IL and reacts with the water therein to form hydrogen chloride (HC1), the hydrogen chloride then reacts with the metal (such as Al or Ag) in the second metal line 202 and/or the first metal line 201 to form corrosion, leading to a reduction in product yield.

For example, in some embodiments, $\alpha 5 > 50°$, and $\alpha 6 > 10°$. For example, $\alpha 5 > \alpha 6$, $\alpha 5 > 70°$, and $\alpha 6 > 15°$. For example, $\alpha 5$ is 75°, 80°, 85°, etc., and $\alpha 6$ is 20°, 25°, 30°, etc.

For example, in some embodiments, the second touch control metal layer TL2 (that is, the second metal line 202) includes a stacked structure of titanium layer-aluminum layer-titanium layer (Ti/Al/Ti) or indium tin oxide layer-silver layer-indium tin oxide layer (ITO/Ag/ITO), and the titanium layer (Ti) or the indium tin oxide layer (ITO) close to the base substrate BS forms the maximum angle $\alpha 5$ and the maximum angle $\alpha 6$.

For example, in some embodiments, $\alpha 5$ is approximately equal to $\alpha 3$, which is beneficial to the narrow frame around the opening O and the consistency of the process.

It should be noted that, in the embodiments of the present disclosure, A is "approximately equal to" B means that the difference between A and B is less than or equal to 10% of A or B.

Figure 35:
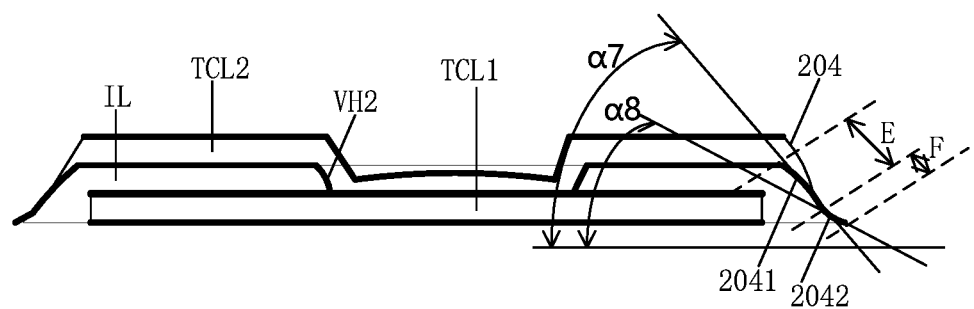
FIG. 35 is a schematic cross-sectional view of the touch control layer in FIG. 6 along a line M-M.

For example, referring to FIG. 6, the touch control layer IL further includes a touch control wire TCL electrically connected to the touch control electrode. For example, FIG. 35 illustrates a schematic cross-sectional view of the touch control wire TCL along a line M-M in FIG. 6. As illustrated in 35, the touch control wire TCL includes a first sub-wire TCL1 located in the first touch control metal layer TL1 and a second sub-wire TCL2 located in the second touch control metal layer TL2, a second via hole VH2 is provided in the interlayer insulation layer IL, and the first sub-wire TCL1 is electrically connected to the second sub-wire TCL2 through the second via hole VH2.

For example, as illustrated in FIG. 35, the second sub-wire TCL2 is provided with a second slope portion 204 on a side edge of the first sub-wire TCL1, the second slope portion 204 includes a third sub-slope portion 2041 and a fourth sub-slope portion 2042, and the third sub-slope portion 2041 is located on a side of the fourth sub-slope portion 2042 away from the base substrate BS. The maximum angle formed between a tangent of any point of the third sub-slope portion 2041 and the main surface of the base substrate BS is $\alpha 7$, and the maximum angle formed between a tangent of any point of the fourth sub-slope portion 2042 and the main surface of the base substrate BS is $\alpha 8$, then $\alpha 7 > \alpha 8$. Thus, the second sub-wire TCL2 can better cover the first sub-wire TCL1 and the interlayer insulation layer IL, so in the process of forming the second sub-wire TCL2, chlorine (Cl2) in the gas used in the etching process is not in contact with the interlayer insulation layer IL at least in the portion of the third sub-slope portion 2041 and the fourth sub-slope portion 2042 that covers the interlayer insulation layer IL, thus avoiding the following problem that may exist in the related technology: because chlorine is in contact with the interlayer insulation layer IL and reacts with the water therein to form hydrogen chloride (HC1), the hydrogen chloride then reacts with the metal (such as Al or Ag) in the second sub-wire TCL2 and/or the first sub-wire TCL1 to form corrosion, leading to a reduction in product yield.

For example, in some embodiments, α7>50°, and α8>10°. For example, α7>α8, α7>70°, and α8>15°. For example, α7 is 75°, 80°, 85°, etc., and α8 is 20°, 25°, 30°, etc.

Figure 36:
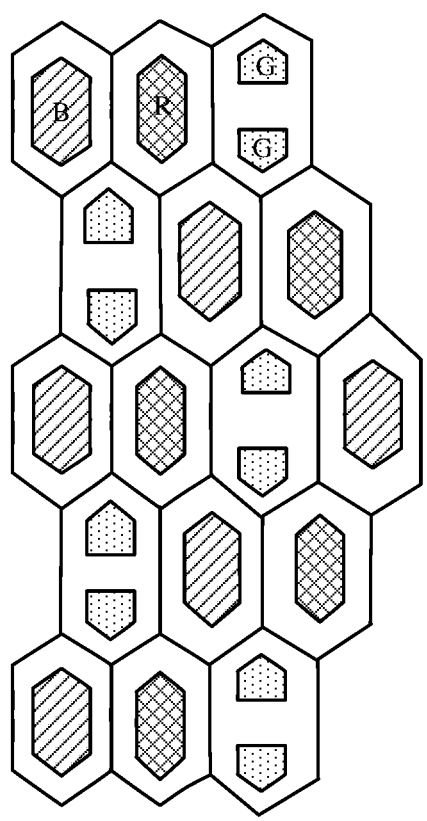
FIG. 36 is a schematic diagram of the arrangement of a plurality of sub-pixels of a display substrate provided by at least one embodiment of the present disclosure.

For example, FIG. 36 illustrates a schematic diagram of the arrangement of a plurality of sub-pixels of a display substrate. As illustrated in FIG. 36, the plurality of sub-pixels include a red sub-pixel R, a blue sub-pixel B, and a green sub-pixel G. In some examples, as illustrated in FIG. 36, one red sub-pixel R, one blue sub-pixel B and two green sub-pixels G form a repeating unit, and a plurality of repeating units are arranged in an array. For example, in some other examples, one red sub-pixel R, one blue sub-pixel B and one green sub-pixel G may also form a repeating unit, and a plurality of repeating units are arranged in an array. The embodiments of the present disclosure do not limit the arrangement manner of the plurality of sub-pixels.

For example, in FIG. 36, the shape of the region occupied by each sub-pixel may be a polygon, such as a hexagon or a pentagon, and in other embodiments, the shape of the region occupied by each sub-pixel may also be a pattern with arched edges such as an ellipse, a semi-ellipse, a circle, a semicircle, a mango shape, etc. The embodiments of the present disclosure do not specifically limit the shape of the region occupied by each sub-pixel.

It should be noted that, in the embodiments of the present disclosure, the base substrate BS may include a flexible insulation material such as polyimide (PI) or a rigid insulation material such as a glass substrate. For example, in some examples, the base substrate BS may be a stacked structure in which a plurality of flexible layers and a plurality of barrier layers are alternately arranged. In this case, the flexible layer may include polyimide, and the barrier layer may include inorganic insulation materials such as silicon oxide, silicon nitride, silicon oxynitride, etc.

For example, the buffer layer 101 may be made of inorganic materials such as silicon nitride, silicon oxide, silicon oxynitride, etc. The active layer AT may be made of materials such as polysilicon, metal oxide, etc., and the first gate insulation layer 102 and the second gate insulation layer 103 may be made of inorganic insulation materials such as silicon oxide, silicon nitride, silicon oxynitride, etc.; the gate electrode GT and the first capacitor electrode CE1 may be made of metal materials such as copper, aluminum, titanium, cobalt, etc., for example, may be formed into a single-layer structure or a multi-layer structure, for example, a multi-layer structure such as titanium/aluminum/titanium, molybdenum/aluminum/molybdenum, etc.; the second capacitor electrode CE2 may be made of metal such as copper, aluminum, titanium, cobalt, etc. or alloy materials, the interlayer insulation layer 104 may be made of inorganic insulation materials such as silicon oxide, silicon nitride, silicon oxynitride, etc., and the passivation layer 1051 may be made of inorganic insulation materials such as silicon oxide, silicon nitride, silicon oxynitride, etc.; and the source and drain electrodes SE and DE may be made of metal materials such as copper, aluminum, titanium, cobalt, etc., for example, may be formed into a single-layer structure or a multi-layer structure, such as titanium/aluminum/titanium, molybdenum/aluminum/molybdenum, etc.

For example, the first electrode S1 is an anode and may be made of metal oxides such as ITO, IZO, etc. or metals such as Ag, Al, Mo, etc. or alloys thereof. The material of the light-emitting layer E2 may be an organic light-emitting material, for example, the material of the light-emitting layer E2 may be a light-emitting material that can emit light of a certain color (such as red light, blue light, or green light, etc.) according to requirements. The second electrode E3 is, for example, a cathode layer and may be made of metals such as Mg, Ca, Li, Al, etc. or alloys thereof, or metal oxides such as IZO, ZTO, etc., or organic materials with conductive properties such as PEDOT/PSS (poly(3,4-ethylenedioxythiophene)/sodium poly-styrene sulfonate). The connection electrode E4 may be made of metal materials such as copper, aluminum, titanium, cobalt, etc. or alloy materials thereof.

For example, the planarization layer 105 (and the planarization layer 1052), the pixel defining layer 106 and the spacer 107 may be made of organic insulating materials such as polyimide, etc. The passivation layer 1051 and the inorganic encapsulation sub-layers 108 and 110 may be made of inorganic insulation materials such as silicon oxide, silicon nitride, silicon oxynitride, etc., and the encapsulation sub-layer 109 may be made of organic materials such as polyimide, resin, etc.

For example, the first touch control metal layer TL1 and the second touch control metal layer TL2 may be made of metal materials, alloy materials, metal oxides, etc., for example, may be formed into a stacked structure such as titanium layer-aluminum layer-titanium layer (Ti/Al/Ti), indium tin oxide layer-silver layer-indium tin oxide layer (ITO/Ag/ITO), etc.

The embodiments of the present disclosure do not specifically limit the materials of various structures of the display substrate.

At least one embodiment of the present disclosure further provides a display device, and the display device includes the display substrate provided by the embodiments of the present disclosure. The display device may be any product or component with a display function such as a mobile phone, a tablet computer, a television, a monitor, a notebook computer, a digital photo frame, a navigator, and the like.

The following statements should be noted:

(1) The drawings involve only the structure(s) in connection with the embodiment(s) of the present disclosure, and other structure(s) can be referred to common design(s).

(2) For clarity, in the drawings used to describe the embodiments of the present disclosure, the thicknesses of layers or regions are enlarged or reduced, that is, the drawings are not drawn to actual scale. It can be understood that when a component such as a layer, film, region or substrate is referred to as being "on" or "under" another component, the component may be "directly" "on" or "under" another component, or one or more intermediate components may be interposed therebetween.

(3) In case of no conflict, features in one embodiment or in different embodiments can be combined to obtain new embodiments.

What is described above is only specific implementations of the present disclosure, the protection scope of the present disclosure is not limited thereto, and the protection scope of the present disclosure should be based on the protection scope of the claims.

The invention claimed is:

1. A display substrate, comprising a display region and an opening located in the display region, wherein the opening penetrates through the display substrate, and the display substrate comprises:
 a base substrate;
 a driving circuit layer, provided on the base substrate and comprising a first signal line at least partially surrounding the opening;

a light-emitting component layer, provided on a side of the driving circuit layer away from the base substrate;

an encapsulation layer, provided on a side of the light-emitting component layer away from the base substrate; and a touch control layer, provided on a side of the encapsulation layer away from the base substrate and comprising a touch control electrode and a touch control compensation electrode, the touch control compensation electrode being electrically connected to the touch control electrode and at least partially surrounding the opening; and the first signal line at least partially overlaps with the touch control compensation electrode in a direction perpendicular to a main surface of the base substrate, the touch control electrode comprises a second touch control electrode extending along a second direction, the second touch control electrode comprises a third sub-touch control electrode, the opening is immediately opened on only one third sub-touch electrode, and an area of the third sub-touch electrode is greater than an area of the opening;

the second touch control electrode further comprises a third sub-touch control electrode first sub-electrode and a third sub-touch control electrode second sub-electrode that are located on opposite sides of the opening in a first direction;

the touch control compensation electrode comprises a first touch control compensation electrode, the first touch control compensation electrode comprises a first sub-compensation electrode and a second sub-compensation electrode both extending along an edge of the opening and located on opposite sides of the opening in a second direction, and the first direction intersects with the second direction; and both ends of the first sub-compensation electrode and both ends of the second sub-compensation electrode are electrically connected to the third sub-touch control electrode first sub-electrode and the third sub-touch control electrode second sub-electrode respectively.

2. The display substrate according to claim 1, wherein the touch control electrode further comprises a first touch control electrode extending along the first direction, and the first touch control electrode comprises a first sub-touch control electrode and a second sub-touch control electrode that are provided adjacent to each other along the second direction;

the touch control compensation electrode comprises a second touch control compensation electrode, and the second touch control compensation electrode comprises a fourth sub-compensation electrode and a fifth sub-compensation electrode extending along the edge of the opening; and the fourth sub-compensation electrode is electrically connected to the first sub-touch control electrode, and the fifth sub-compensation electrode is electrically connected to the second sub-touch control electrode.

3. The display substrate according to claim 2, wherein the fourth sub-compensation electrode comprises a first connection portion for electrical connection, and the fifth sub-compensation electrode comprises a second connection portion for electrical connection;

in the direction perpendicular to the main surface of the base substrate, the first connection portion and the first sub-compensation electrode have a first overlapping region, and/or the second connection portion and the second sub-compensation electrode have a second overlapping region.

4. The display substrate according to claim 3, wherein at least one of the first connection portion and the first sub-compensation electrode is provided with a hollow portion in the first overlapping region, and/or at least one of the second connection portion and the second sub-compensation electrode is provided with a hollow portion in the second overlapping region.

5. The display substrate according to claim 1, wherein the first signal line comprises a first sub-signal line surrounding the opening, and a longitudinal cross-section of the first sub-signal line is provided with at least one bent portion.

6. The display substrate according to claim 5, wherein the first signal line further comprises a second sub-signal line and a third sub-signal line both surrounding the opening, the first sub-signal line is located on a side of the second sub-signal line away from the base substrate, and the third sub-signal line is located on a side of the first sub-signal line away from the base substrate; and an included angle between a side wall of the third sub-signal line and the main surface of the base substrate is $\alpha 2$, an included angle between a side wall of the first sub-signal line and the main surface of the base substrate is $\alpha 3$, and an included angle between a side wall of the second sub-signal line and the main surface of the base substrate is $\alpha 4$, then $$\alpha 3 \leq \alpha 4 \text{ and } \alpha 3 \leq \alpha 2, \text{ where } \alpha 2 < 75°, \alpha 3 > 30°, \text{ and } 40° < \alpha 4 < 50°.$$

7. The display substrate according to claim 6, wherein the driving circuit layer comprises a plurality of pixel driving circuits, the light-emitting component layer comprises a plurality of light-emitting components, and the plurality of pixel driving circuits are respectively electrically connected to the plurality of light-emitting components to respectively drive the plurality of light-emitting components;

the pixel driving circuit comprises a thin film transistor and a storage capacitor, the thin film transistor comprises a gate electrode, a source electrode and a drain electrode provided on the base substrate, the source electrode and drain electrode are provided on a side of the gate electrode away from the base substrate, the storage capacitor comprises a first capacitor electrode and a second capacitor electrode provided on the base substrate, and the second capacitor electrode is provided on a side of the first capacitor electrode away from the base substrate; and the first sub-signal line is provided in a same layer and with a same material as the source electrode and the drain electrode, and the gate electrode is provided in a same layer and with a same material as the first capacitor electrode.

8. The display substrate according to claim 1, further comprising a light-shielding ring surrounding the opening, and the light-shielding ring is provided in a same layer and with a same material as the touch control layer.

9. The display substrate according to claim 8, wherein in a direction parallel to the main surface of the base substrate, the light-shielding ring is located on a side of the touch control compensation electrode close to the opening, and the first signal line is provided within a range defined by the touch control compensation electrode and the light-shielding ring.

10. The display substrate according to claim 9, wherein in the direction perpendicular to the main surface of the base substrate, the first signal line at least partially overlaps with the light-shielding ring.

11. The display substrate according to claim 8, wherein the light-shielding ring comprises a plurality of light-shielding portions spaced apart from each other.

12. The display substrate according to claim 8, further comprising a detection wire surrounding the opening, wherein the detection wire is electrically connected to the touch control electrode.

13. The display substrate according to claim 7, further comprising a barrier dam surrounding the opening, wherein the barrier dam is located on a side of the first signal line close to the opening.

14. The display substrate according to claim 7, wherein the pixel driving circuit further comprises a plurality of insulation sub-layers, and the plurality of insulation sub-layers are respectively provided between the gate electrode and the second capacitor electrode and between the second capacitor electrode and the source electrode as well as the drain electrode; and the display substrate further comprises a groove surrounding the opening, and the groove is located on a side of the first signal line close to the opening, and is at least provided in one of the plurality of insulation sub-layers or the base substrate.

15. The display substrate according to claim 6, wherein the touch control layer comprises a first touch control metal layer, an interlayer insulation layer and a second touch control metal layer which are sequentially stacked in a direction away from the base substrate, the touch control electrode comprises a first metal line located in the first touch control metal layer and a second metal line located in the second touch control metal layer, a first via hole is provided in the interlayer insulation layer, and the first metal line is electrically connected to the second metal line through the first via hole.

16. A display device, comprising the display substrate according to claim 1.

17. The display substrate according to claim 3, wherein the opening is provided with a center R, and an included angle between a line, which is from any point of an overlapping part of the first connection portion and the first sub-compensation electrode to the center R, and an extension direction of the first connection portion is $\alpha 1$, then $\alpha 1 < 20°$; and/or an included angle between a line, which is from any point of an overlapping part of the second connection portion and the second sub-compensation electrode to the center R, and an extension direction of the second connection portion is $\theta 1$, then $\theta 1 < 20°$.

18. The display substrate according to claim 4, wherein an overlapping area of the first connection portion and the first sub-compensation electrode is S1, the first sub-compensation electrode is provided with a hollow portion, and an area of the hollow portion of the first sub-compensation electrode is S1,' then $0.40 < S1/(S1+S1') < 0.71$; and/or an overlapping area of the second connection portion and the second sub-compensation electrode is S2, the second sub-compensation electrode is provided with a hollow portion, and an area of the hollow portion of the second sub-compensation electrode is S2', then $0.40 < S2/(S2+S2') < 0.71$.

19. The display substrate according to claim 4, wherein an overlapping area of the first connection portion and the first sub-compensation electrode is S1, the first sub-compensation electrode is provided with a hollow portion, and an area of the hollow portion of the first sub-compensation electrode is S1'; and the opening is provided with a center R, and an included angle between a line, which is from any point of an overlapping part of the first connection portion and the first sub-compensation electrode to the center R, and an extension direction of the first connection portion is $\alpha 1$, then $$\alpha 1 < 20° \text{ and } 0.40 < S1/(S1+S1') < 0.71.$$

20. The display substrate according to claim 3, wherein an interlayer insulation layer is provided between the first connection portion and the first sub-compensation electrode, and a material of the interlayer insulation layer is at least one of SIN, SiO, SiON and OC.

* * * * *